US011948877B2

(12) United States Patent
Patil et al.

(10) Patent No.: US 11,948,877 B2
(45) Date of Patent: Apr. 2, 2024

(54) HYBRID PACKAGE APPARATUS AND METHOD OF FABRICATING

(71) Applicant: QUALCOMM Incorporated, San Diego, CA (US)

(72) Inventors: Aniket Patil, San Diego, CA (US); Hong Bok We, San Diego, CA (US); Brigham Navaja, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 134 days.

(21) Appl. No.: 17/211,164

(22) Filed: Mar. 24, 2021

(65) Prior Publication Data

US 2021/0305141 A1 Sep. 30, 2021

Related U.S. Application Data

(60) Provisional application No. 63/002,750, filed on Mar. 31, 2020.

(51) Int. Cl.
*H01L 23/498* (2006.01)
*H01L 21/48* (2006.01)
(Continued)

(52) U.S. Cl.
CPC .... *H01L 23/49833* (2013.01); *H01L 21/4857* (2013.01); *H01L 23/3135* (2013.01);
(Continued)

(58) Field of Classification Search
CPC ........... H01L 23/49833; H01L 23/3135; H01L 23/49822; H01L 23/3128; H01L 23/50; H01L 23/49816; H01L 23/5389; H01L 21/4857; H01L 21/4853; H01L 21/56; H01L 21/68538; H01L 25/105; H01L 24/16; H01L 24/81; H01L 2224/16227; H01L 2224/81005; H01L 2225/1035;
(Continued)

(56) References Cited

U.S. PATENT DOCUMENTS 6,281,446 B1 8/2001 Sakamoto et al.
10,163,798 B1 * 12/2018 Alur .................. H01L 24/16
(Continued)

FOREIGN PATENT DOCUMENTS

CN 110265384 A * 9/2019 ....... H01L 23/49822
WO 2017171738 A1 10/2017

OTHER PUBLICATIONS

International Search Report and Written Opinion—PCT/US2021/024783—ISA/EPO—dated Jun. 24, 2021.

*Primary Examiner* — Kyoung Lee
*Assistant Examiner* — Christina A Sylvia
(74) *Attorney, Agent, or Firm* — Loza & Loza, LLP

(57) ABSTRACT

Some features pertain to a hybrid package that includes a die, a first substrate structure, and a first metallization structure that is at least partially coplanar with the substrate. The die is electrically coupled to the first metallization structure and the first substrate through a second metallization structure. The first metallization structure is configured to provide an electrical path for data signaling. The second metallization structure is configured as a ground plane and is coupled to a ground signal. The first substrate structure is configured to provide an electrical path for power signaling.

24 Claims, 20 Drawing Sheets

(51) Int. Cl.
    *H01L 23/31*       (2006.01)
    *H01L 25/10*       (2006.01)
    *H01L 23/00*       (2006.01)

(52) U.S. Cl.
    CPC ...... *H01L 23/49822* (2013.01); *H01L 25/105* (2013.01); *H01L 21/4853* (2013.01); *H01L 24/16* (2013.01); *H01L 2224/16227* (2013.01); *H01L 2225/1035* (2013.01)

(58) Field of Classification Search
    CPC ..... H01L 2225/1023; H01L 2225/1041; H01L 2225/1058; H01L 2221/68345; H01L 2221/68359; H01L 2221/68372; H01L 2924/15192; H01L 2924/15311
    See application file for complete search history.

(56) References Cited

U.S. PATENT DOCUMENTS

| | | | |
|---|---|---|---|
| 2008/0239685 A1 | 10/2008 | Kawabe et al. | |
| 2013/0032390 A1* | 2/2013 | Hu | H01L 23/49833 174/266 |
| 2014/0103488 A1* | 4/2014 | Chen | H01L 24/19 257/532 |
| 2016/0043047 A1 | 2/2016 | Shim et al. | |
| 2018/0211926 A1 | 7/2018 | Jang et al. | |
| 2019/0057915 A1* | 2/2019 | Starkston | H01L 23/13 |
| 2019/0164938 A1 | 5/2019 | Lee | |
| 2019/0279936 A1* | 9/2019 | Lin | H01L 23/5386 |
| 2019/0304912 A1* | 10/2019 | Ecton | H01L 21/4853 |
| 2019/0393112 A1* | 12/2019 | Nofen | H01L 23/293 |
| 2020/0411445 A1* | 12/2020 | Chen | H01L 24/19 |

\* cited by examiner

US 11,948,877 B2

HYBRID PACKAGE APPARATUS AND METHOD OF FABRICATING

CLAIM OF PRIORITY UNDER 35 U.S.C. § 119

This application claims the benefit of priority of U.S. Provisional Application No. 63/002,750, entitled "HYBRID PACKAGE APPARATUS AND METHOD OF FABRICATING" and filed on Mar. 31, 2020, which is hereby expressly incorporated by reference herein in entirety as part of the disclosure of this application

BACKGROUND

Field of the Disclosure

Various features relate to a hybrid package including a package substrate and an at least partially co-planar metallization structure.

Background

Integrated circuits, integrated circuit packages and electronic devices are being continually driven to smaller form factors. The connections between such devices are correspondingly being driven to have smaller width and finer pitches to increase input/output while still maintaining the smaller form factor.

Furthermore, integrated circuit packages support various types of signaling including power signaling, data signaling, and ground signal.

SUMMARY

Various features relate to a hybrid package including a package substrate and an at least partially co-planar metallization structure.

A first example provides a package includes a die, a first substrate structure, and a first metallization structure at least partially coplanar with the first substrate structure. The die is electrically coupled to the first metallization structure and the first substrate structure.

A second example provides a method of forming a package, including forming a first metallization structure, forming a first substrate structure, the first substrate structure at least partially coplanar with the first substrate structure on a horizontal plane, and forming a die that is electrically coupled to the first metallization structure and the first substrate structure.

DRAWINGS

Various features, nature and advantages may become apparent from the detailed description set forth below when taken in conjunction with the drawings in which like reference characters identify correspondingly throughout.

DETAILED DESCRIPTION

Figure 1A:
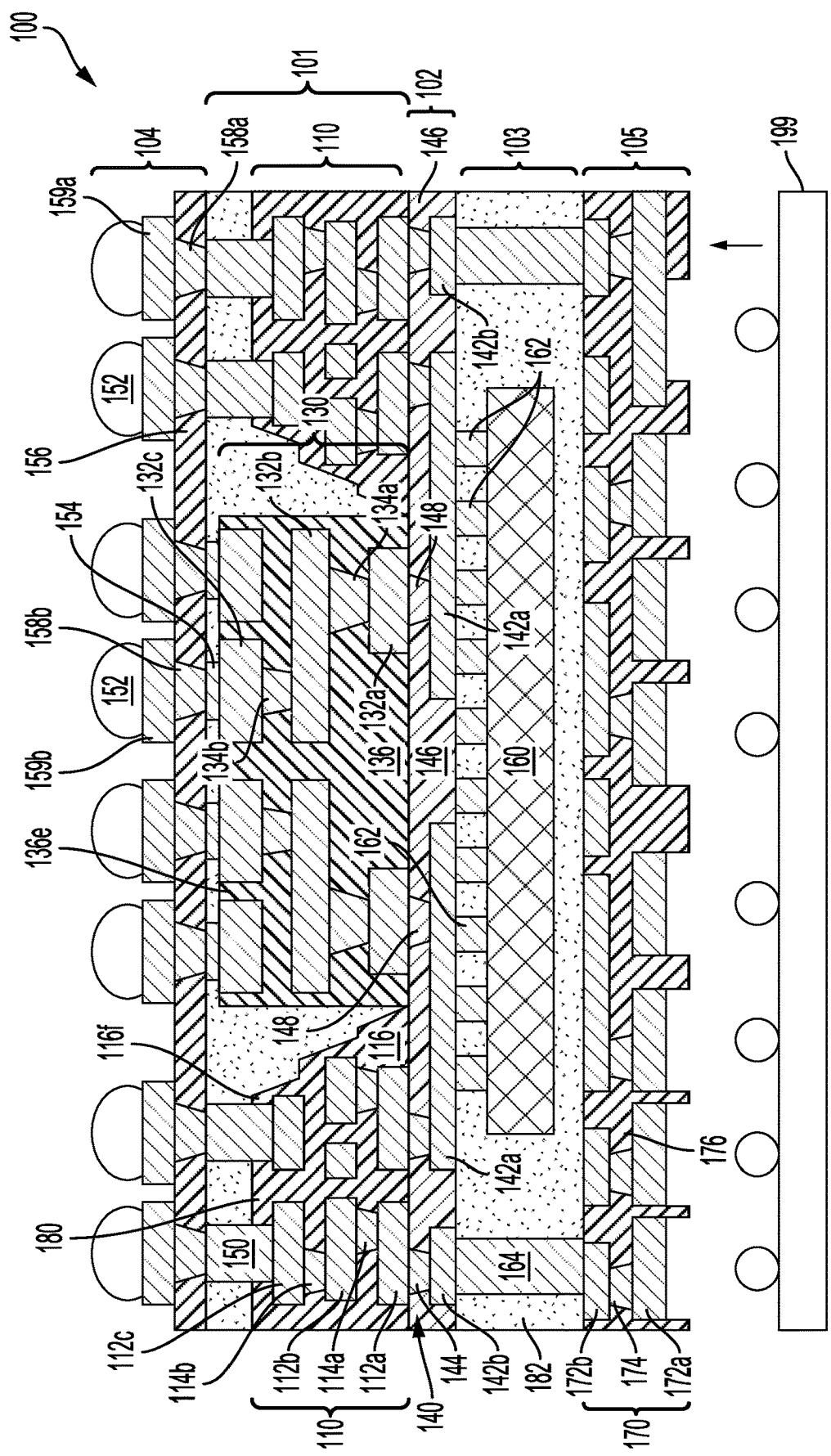
FIG. 1A illustrates cross-section view of a hybrid package.

In the following description, specific details are given to provide a thorough understanding of the various aspects of the disclosure. However, it will be understood by one of ordinary skill in the art that the aspects may be practiced without these specific details. For example, circuits may be shown in block diagrams to avoid obscuring the aspects in unnecessary detail. In other instances, well-known circuits, structures and techniques may not be shown in detail in order not to obscure the aspects of the disclosure.

Overview

Some features pertain to a hybrid package. The hybrid package includes a first portion that includes a first metallization structure and a plurality of interconnects such as copper pillars or through mold vias for electrically coupling to a fourth portion of the hybrid package. The first metallization structure also includes a plurality of interconnects including metal for electrical coupling (i.e., electrical connections) within the first metallization structure. The first portion also includes a first substrate structure including a plurality of substrate interconnects such as copper pillars or through mold vias for electrically connecting to a fourth portion of the hybrid package.

The first metallization structure is at least partially coplanar with the first substrate structure on a horizontal plane, and is adjacent to the first substrate. In a first example, a topmost substrate dielectric layer is higher than a topmost dielectric layer of the first metallization structure. Other portions of the first metallization structure are coplanar with the first substrate structure.

A first mold at least partially surrounds and covers the first metallization structure and the first substrate structure. The first mold at least partially separates the first metallization structure and the first substrate structure.

The fourth portion of the hybrid package is over the first portion. The fourth portion of the hybrid package is configured to electrically couple the hybrid package to a printed circuit board (PCB). The fourth portion of the hybrid package includes a plurality of interconnects and solder balls for coupling the hybrid package to the PCB.

A second portion of the hybrid package is under and adjacent to the first portion. A second portion of the hybrid package includes a second metallization structure that includes a plurality of interconnects for electrical coupling to the second portion. Optionally, the second metallization may have an additional plurality of interconnects for electrically coupling to a third portion of the hybrid package.

A third portion of the hybrid package is under and adjacent to the second portion. The third portion includes a die with a plurality of interconnects for coupling to the second portion. The die and the die's plurality of interconnects are at least partially surrounded by a second mold. The hybrid package may optionally be coupled to a second package in a package-on-package (POP) configuration. If a POP configuration is selected, the third portion may optionally include through mold vias configured to electrically couple to an optional fifth portion.

The optional fifth portion of the hybrid package includes a third metallization structure for coupling the hybrid package to the second package.

The second metallization structure may be coupled to a ground signal, such that the second metallization is grounded or configured to operate as a ground plane. The first metallization structure may be configured to provide an electrical path for data signaling. The first substrate structure may be configured to provide an electrical path for power (e.g., for power distribution network or for power signaling).

In one example, the hybrid package may include surface mount devices (SMD) such as resistors, capacitors, or inductors. The SMD may be located in place of solder balls in the fourth portion of the hybrid package. The SMD may be located within the second mold of the third portion of the hybrid package.

The first metallization structure includes a plurality of first interconnects including pads having a first thickness, and the first substrate structure includes a plurality of substrate interconnects including pads having a second thickness, wherein the second thickness is greater than the first thickness. Furthermore, the first metallization structure includes a plurality of first vias having a first via width, the first substrate includes a plurality of substrate vias having a substrate via width, wherein the substrate via width is greater than the first via width.

Advantageously, because the first metallization structure has a first thickness associated with its plurality of interconnects that is less than a second thickness associated with the plurality of substrate interconnects, and a first width associated with respect to its plurality of vias that is less than a second width associated with the plurality of substrate vias, the first metallization structure has an improved signal integrity due to a lower impedance in the plurality of interconnects and the plurality of vias. These first thickness and first width features of the first metallization structure allow it to be particularly suited to providing an electrical path for data signaling, as it is advantageous for a data signaling path to have low impedance to obtain high speed data signaling.

Advantageously, because the first substrate structure has a second thickness associated with its plurality of substrate interconnects and a second width associated with its plurality of substrate vias that is thicker and wider, respectively than the first thickness and first width associated with the plurality of interconnects and plurality of vias of the first metallization structure, the first substrate structure is better able to distribute power by way of the greater surface area of the plurality of substrate interconnects and substrate vias. Additionally, the above mentioned second thickness and second width features of the first substrate structure allow for improved thermal heat distribution.

The hybrid package includes both the first metallization structure with first thickness and first width features, and the first substrate structure with second thickness and second width features. The hybrid package's area is reduced as compared to a traditional package where all of the interconnects (e.g., pads and traces) are configured to accommodate power signals. This is because area is reduced by utilizing the first metallization structure, with first thickness and first width features (i.e., reduced thickness and reduced with), for data signaling.

Terms and Definitions

In some implementations, an interconnect is an element or component that allows or facilitates an electrical connection between two points, elements and/or components. In some implementations, an interconnect may include a trace, a pad, a pillar, a redistribution metal layer, an under bump metallization (UBM) layer, solder (e.g., solder balls). In some implementations, an interconnect is an electrically conductive material (e.g., metal) that may be configured to provide an electrical path for a signal (e.g., data signal, ground signal, power signal). An interconnect may be part of a device, electronic component, substrate, interposer, printed circuit board (PCB), die, die interconnect, or circuit. In some implementations, an interconnect may include more than one element or component.

A trace is a form of an interconnect that provides an electrical path along a horizontal or near horizontal direction in a device. In some implementations, a trace may be formed in a substrate or may be formed on the substrate.

A pad is a form of an interconnect that provides an electrical path in an integrated device. In some implementations, a pad is an element or component that provides a coupling interface for an interconnect made of a different material. For example, a pad may be configured to provide an interface for a solder (e.g., solder ball).

A via provides an electrical path along a vertical or near vertical direction in an integrated device. In some implementations, a via may be formed in a substrate (e.g., through substrate via). In some implementations, a via may be formed in a mold layer (e.g., through mold via). In some implementations, a via may have vertical walls, or may have tapered or sloped walls or other orientations.

The term "thickness" may be defined as a vertical measurement of an object. In other words, thickness may be defined as the measurement from the bottom to the top of an object.

The term "width" may be defined as a lateral or horizontal measurement of an object when the object is viewed in a cross-section view. For example, the width of a via (e.g., 114) is the lateral or horizontal measurement of the via from a first sidewall (or first side) to its second sidewall (or second side).

Unless stated otherwise, the term coupled means electrically (e.g., conductively) coupled. Furthermore, an object or component or device A may be coupled to device C even though there are one or more intermediary components in between.

As used herein, the term "ground" is a conductive point or plane where the potential for the ground or grounded conductive point or plane is taken as the reference potential from which other voltages in the circuit are measured. Furthermore, the grounded conductive point or plane provides a low impedance path for return currents. Such a grounded conductive point or grounded conductive plane such as a metal layer shall be understood to provide a ground signal. Although the grounded conductive point or plane provides a low impedance path, the potential of the grounded conductive point or plane (e.g., the ground signal) need not be at zero voltage.

Hybrid Package Apparatus

Figure 1B:
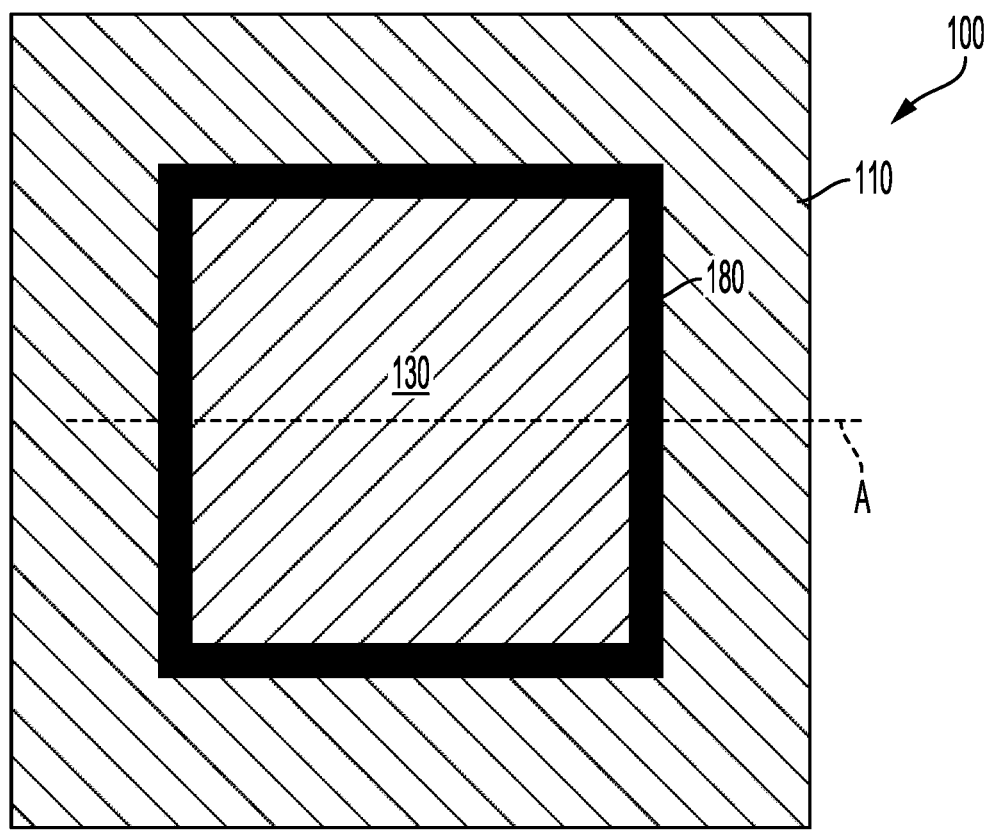
FIG. 1B illustrates a simplified top view of the hybrid package.

FIG. 1A illustrates cross-section view of a hybrid package 100 including a first metallization structure and a first substrate structure. FIG. 1B illustrates a simplified top view of the hybrid package 100 of FIG. 1A.

FIG. 1A illustrates a first portion 101 of the hybrid package 100 including a first metallization structure 110, a first substrate structure 130, and a first mold 180. A second portion 102 of the hybrid package 100 includes a second metallization structure 140. The second portion 102 of the hybrid package 100 is under and adjacent to the first portion 101. A third portion 103 of the hybrid package 100 includes a die 160 and a second mold 182. A fourth portion 104 of the hybrid package 100 includes a metallization structure including solder balls 152 that are configured to couple the hybrid package 100 to a printed circuit board (PCB) (not shown). An optional fifth portion 105 of the hybrid package 100 includes an optional third metallization structure 170 configured to couple the hybrid package 100 to an optional second package 199 in a package-on-package configuration.

The fourth portion 104 is over the first portion 101, the second portion 102, the third portion 103, and the optional fifth portion 105. The first portion 101 of the hybrid package 100 is over both the second 102 portion, the third portion 103, and the optional fifth portion 105 of the hybrid package 100. The first portion 101 is immediately under the fourth portion 104. The second portion 102 of the hybrid package 100 is over the third portion and the optional fifth portion of the hybrid package 100. The second portion 102 is immediately under the first portion 101 and intermediately under the fourth portion 104. The third portion 103 of the hybrid package 100 is over the optional fifth portion of the hybrid package 100. The third portion 103 is immediately under the second portion 102 and intermediately under the fourth portion 104 and the first portion 101.

The optional fifth portion 105 of the hybrid package 100 is at the bottom of the package, underneath the fourth, first, second, and third portions (i.e., 104, 101, 102, 103 respectively).

It shall be understood that the terms "over" and "under" include partially over, and partially under respectively. In other words, the term "over" and "under" do not require the object be completely over or under. Furthermore, the term "over" and is a relative term and what is described as "over" may be "under" if the hybrid 100 package is rotated or flipped over. Likewise, the term "under" is a relative term and what is described as "under" may be "over" if the hybrid 100 package is rotated or flipped over.

The first portion 101 includes the first metallization structure 110. The first metallization structure 110 includes a plurality of first interconnects 112 (e.g., pads and traces such as 112a, 112b, 112c), a plurality of first vias 114 (e.g., 114a, 114b), a plurality of first dielectric layers 116 (including topmost dielectric layer 116f), and a plurality of sixth interconnects 150. The plurality of first interconnects 112 are electrically coupled together through the plurality of first vias 114. The plurality of first dielectric layers 116 are insulator layers configured to at least partially surround and electrically insulate each of the plurality of first interconnects 112 and each of the plurality of first vias 114.

The first metallization structure 110 is electrically coupled to the second metallization structure 140, by way of the first interconnect 112a of the plurality of first interconnects 112 being directly coupled to second vias 144a and 144b of the plurality of second vias 144 of the second metallization structure 140.

Each of the plurality of sixth interconnects 150 is directly coupled to one of the topmost first interconnect 112c of the plurality of first interconnects 112, respectively. The first metallization structure 110 is directly coupled to the fourth portion 104 by way of each of the plurality of sixth interconnects 150 being directly coupled to the plurality of fourth vias 158a respectively. Each one of the plurality of sixth interconnects 150 may be a copper pillar, or a pillar, or cylindrical bump.

The plurality of first interconnects 112 each have a first thickness, where the first thickness is measured in a vertical direction of the cross section of FIG. 1A. In one example, the first thickness of at least some of the plurality of first interconnects 112 may be between 2 µm-10 µm, but is not so limited. Additionally, the plurality of first vias 114 each have a first via width, where the first via width is measured in a horizontal direction of the cross section of FIG. 1A. In one example, the first via width of at least some of the plurality of first vias 114 may be between 10 µm to 50 µm but is not so limited. The plurality of first dielectric layers 116 each have a first dielectric thickness measured in a vertical direction of the cross section of FIG. 1A. The first dielectric thickness is between 5 µm to 10 µm. In another example, the first dielectric thickness is between 5 µm to 15 µm.

The first metallization structure 110 is configured to provide an electrical path for data signaling. The first metallization structure is configured to receive data signaling from the die 160. Alternatively, the first metallization structure 110 is configured to receive data signaling from a PCB (not shown) or from an optional second package 199. The electrical path for data signaling will be discussed in detail further on. The first metallization structure 110 is configured as a redistribution layer (RDL).

As will be discussed further below, the first thickness of the first interconnects 112 and the first via width of the plurality of first vias 114 is smaller than respective elements of the first substrate structure 130. Advantageously, the first metallization structure is able to achieve a higher density of data signaling paths because of the finer line and space of the plurality of first interconnects 112 and the plurality of first vias 114.

The first metallization structure 110 is least partially coplanar with the first substrate structure 130 in a horizontal plane, and is adjacent to the first substrate structure 130. In one aspect, the topmost portion 110a of the first metallization structure 110 is not coplanar with a topmost portion 130a of the first substrate structure 130, because the first substrate structure 130 is taller or higher than the first metallization structure 110. However, the first metallization structure 110 is coplanar with the first substrate structure 130 in other horizontal planes (i.e., the first metallization structure 110 and the first substrate structure 130 are adjacent).

In one aspect, the topmost portion 110a of the first metallization structure 110 is the topmost dielectric layer 116f of the plurality of first dielectric layers 116, and the topmost portion 130a of the first substrate structure 130 is the topmost substrate dielectric layer 136e of the plurality of substrate dielectric layers 136 As used here, the term topmost does not include the topmost interconnects, such as the plurality of sixth interconnects 150 of the first metallization structure 110 or the plurality of seventh interconnects 154 of the first substrate structure 130, as these top interconnects may be planar relative to each other.

The first substrate structure 130 may be a metallization build-up, a laminate substrate, or an organic material such as Bismaleimide Triazine (BT), FR-4 (or also known as FR4, a NEMA grade designation for glass-reinforced epoxy laminate material), or a liquid crystal polymer, or a polyimide, or an epoxy mold compound. The first substrate structure 130 includes the following: a plurality of substrate interconnects 132 (e.g., pads and traces such as 132a, 132b, and 132c), a plurality of substrate vias 134 (e.g., 134a and 134b), a plurality of substrate dielectric layers 136 (including topmost dielectric layer 136e), and a plurality of seventh interconnects 154. The plurality of substrate interconnects 132 are electrically coupled together through the plurality of substrate vias 134. The plurality of substrate dielectric layers 136 are insulator layers configured to at least partially surround and electrically insulate each of the plurality of substrate interconnects 132 and each of the plurality of substrate vias 134. The first substrate structure 130 is coupled to the second metallization structure 140, by way of the substrate interconnect 132a of the first substrate structure 130 being directly coupled to the plurality of solder interconnects 148 of the second metallization structure 140.

The plurality of seventh interconnects 154 are electrically coupled to the topmost substrate interconnect 132c of the plurality of substrate interconnects 132. The plurality of seventh interconnects 154 are configured to couple the first substrate structure 130 to the fourth portion 104 of the hybrid package 100 by way of the topmost substrate interconnects 132c being directly coupled to some of the plurality of fourth vias 158b, respectively. Each one of the plurality of seventh interconnects 154 may be a copper pillar, or a pillar, or cylindrical bump.

The plurality of substrate interconnects 132 each have a second thickness, where the second thickness is measured in a vertical direction of the cross section of FIG. 1A. The second thickness of at least some of the plurality of substrate interconnects 132 may be between 10 μm to 30 μm. The second thickness of the plurality of substrate interconnects 132 may be greater than the first thickness of the plurality of first interconnects 112 of the first metallization structure 110.

Additionally, the plurality of substrate vias 134 each have a substrate via width, where the substrate via width is measured in a horizontal direction of the cross section of FIG. 1A. The substrate via width of at least some of the plurality of substrate vias 134 may be between 50 μm to 100 μm. The substrate via width of the plurality of substrate vias 134 may be greater than the first via width of the plurality of first vias 114 of the first metallization structure 110.

The first substrate structure 130 is configured to provide an electrical path for power (i.e., the first substrate structure 130 is operable as a power distribution network) as will be discussed further later on.

Advantageously, because the first metallization structure 110 has a first thickness (measured in a vertical direction) associated with each of the plurality of interconnects 112 that is less than a second thickness (measured in a vertical direction) associated with the plurality of substrate interconnects 132, and a first via width (measured in a horizontal direction) associated with respect to each of the plurality of first vias 114 that is less than a substrate via width associated with each of the plurality of substrate vias 134, the first metallization structure 110 has an improved signal integrity due to a lower impedance in the plurality of interconnects 112 and the plurality of vias 114. These first thickness and first via width features of the first metallization 110 structure allow it to be particularly suited to providing an electrical path for data signaling, as it is advantageous for a data signaling path to have low impedance to obtain high speed data signaling.

Advantageously, because the first substrate structure 130 has a second thickness associated with its plurality of substrate interconnects 132 and a substrate via width associated with its plurality of substrate vias 134 that is thicker and wider, respectively, than the first thickness and first via width associated with the plurality of interconnects 112 and plurality of vias 114 of the first metallization structure 110, the first substrate structure 130 is better able to distribute power (e.g., because it operates as a power distribution network) by way of the greater surface area of the plurality of substrate interconnects 132 and plurality of substrate vias 134. Additionally, the above mentioned second thickness and substrate via width features of the first substrate structure 130 allow for improved thermal heat distribution.

The hybrid package includes both the first metallization structure 110 with the first thickness and first via width features, and the first substrate structure 130 with second thickness and substrate via width features. The hybrid package's 100 area is reduced as compared to a traditional package where all of the interconnects (e.g., pads and traces) are configured to accommodate power signals. This is because area is reduced by utilizing the first metallization structure 110, with the first thickness and the first via width features (i.e., reduced thickness and reduced with), for data signaling.

Furthermore, because the first substrate structure 130 is configured as a power distribution network, the first substrate structure 130 may experience higher temperatures than if it was configured as a ground plane. Therefore, the thicker plurality of substrate interconnects 132 and the wider plurality of substrate vias 134 provide increased surface area for greater heat dissipation.

The first substrate structure 130 is at least partially coplanar with the first metallization structure 110 and the first substrate structure 130 is adjacent to the first metallization structure 110. The first substrate structure 130 is surrounded by the first metallization structure 110 (as will be discussed further with respect to FIG. 1B). The first mold 180 at least partially surrounds the first metallization structure 110 and the first substrate structure 130. The first mold 180 at least physically separates, and electrically insulates the first metallization structure 110 and the first substrate structure 130 from each other. The first mold 180 provides structural support for the first metallization structure 110 and the first substrate structure 130.

The topmost portion 130a of the first substrate structure 130 may be higher or taller than topmost portion 110a of the first metallization structure 110. As used herein, the term "higher" may or may not take into account the actual height of the first substrate structure 130 as compared to (or relative to) the actual height of the first metallization structure 110. However, the term "higher" as used herein, means that the topmost portion 130a of the first substrate structure 130 as illustrated in FIG. 1A is above (but not necessarily overlapping) the topmost portion 110a of the first metallization structure 110, regardless of where each of the bottom side of the first substrate structure 130 and the bottom side of the first metallization structure 110 is located.

Turning to FIG. 1B, FIG. 1B illustrates a simplified top view of the hybrid package 100 of FIG. 1A (where FIG. 1A is a cross section of FIG. 1B taken at "A"). For simplicity, FIG. 1B does not illustrate all of the components of FIG. 1A. FIG. 1B illustrates the first substrate structure 130 completely surrounded by the first metallization structure 110. In other words, the first metallization structure 110 as illustrated in FIG. 1B, is a single structure that surrounds the first substrate structure 130. The first mold 180 physically separates the first substrate structure 130 from the first metallization structure 110. Furthermore, the first mold 180 electrically insulates the first substrate structure 130 from the first metallization structure 110.

Although FIG. 1B illustrates the first metallization structure as surrounding the first substrate structure 130, it is not so limited. In another aspect, the first metallization structure 110 may include multiple portions (e.g., a first portion, a second portion, etc.,) that partially or completely surround the first substrate structure 130 but are physically separated by mold such as the first mold 180. In yet another aspect, the first metallization structure 110 may only partially surround the first substrate 130 structure.

Turning back to FIG. 1A, FIG. 1A further illustrates the second portion 102 including the second metallization structure 140. The second metallization structure 140 is located between the die 160 and the first metallization structure 110, and between the die 160 and the first substrate structure 130. The second metallization structure 140 includes a plurality of second interconnects 142 (e.g., pads or traces such as 142a and 142b), a plurality of second vias 144 (e.g., 144a and 144b), a plurality of solder interconnects 148, and a plurality of second dielectric layers 146.

A first subset 144a of the plurality of second vias 144 are configured to couple the die 160 (in the third portion 103) to the first metallization structure 110 (or the first portion of the hybrid package 100) by way of the plurality of second interconnects 142a.

A second subset 144b of the plurality of second vias 144 is optional and configured to couple the plurality of first interconnects (e.g., 112a) to the plurality of second interconnects 142 (e.g., 142b). That is, the second subset 144b of is configured to couple the optional fifth portion of the hybrid package 100 to the first metallization structure 110 (or the first portion of the hybrid package 100). If the optional fifth portion of the hybrid package 100 is omitted, then the first subset 144b of the plurality of second vias 144 may also be omitted.

The plurality of solder interconnects 148 are electrically coupled to the plurality of second interconnects 142 (e.g., 142a). The plurality of solder interconnects 148 are configured to electrically couple the die 160 to the first substrate structure 130 by way of the plurality of second interconnects 142a.

The second metallization structure 140 is configured as a ground plane, i.e., the second metallization structure 140 is coupled to a ground signal and serves as a return path for current from different components on the board.

The third portion 103 of the hybrid package 100 includes the third metallization structure 170. The third metallization structure 170 includes the die 160, a plurality of third interconnects 162, (e.g., flip chip bumps), a second mold 182, and an optional plurality of through mold vias 164. The die 160 as illustrated, is a flip chip, but is not so limited. The die 160 may also be any die that includes copper plating on its pads. The die 160 includes an active side (an active side is the side of the die including active circuit components such as transistors). The active side of the die 160 is the side of the die 160 that is nearest the second metallization structure 140. The die 160 includes a back side (that does not include transistors). The back side of the die 160 is the side of the die 160 that is the furthest from the second metallization structure 140.

The second mold 182 at least partially surrounds and covers the die, and the plurality of third interconnects 162. A first side (i.e., a top side) of the second mold 182 is directly connected to the second metallization structure 140. A second side (i.e., a bottom side) of the second mold 182 directly connected to the third metallization structure 170. The second mold 182 also at least partially surrounds the optional plurality of through mold vias 164.

The plurality of through mold vias 164 are configured to couple to the plurality of second interconnects 142b in the second metallization structures 140

A subset or a portion of the plurality of third interconnects 162 are configured to couple the die 160 to the plurality of second interconnects 142 (e.g., 142a) of the second metallization structure 140. That is, the third metallization structure 170 is electrically coupled to the second metallization structure 140, and the second metallization structure 140 is electrically coupled to both the first metallization structure 110 and to the first substrate structure 130.

The fourth portion 104 of the hybrid package 100 includes at least one dielectric layer 156, a plurality of fourth vias (e.g., 158a, 158b), a plurality of fourth interconnects (e.g., 159a, 159b), and a plurality of solder balls 152. The fourth portion 104 of the hybrid package 100 is configured to be electrically coupled, by way of the plurality of solder balls 152, to a printed circuit board (not shown).

The plurality of fourth vias 158b is coupled to the plurality of seventh interconnects 154 of the first substrate structure 130. Therefore, the fourth portion 104 of the hybrid package 100 is electrically coupled to the first substrate structure 130. Furthermore, the plurality of fourth vias 158a is electrically coupled to the plurality of sixth interconnects 150 of the first metallization structure 110. Therefore, the fourth portion 104 of the hybrid package 100 is electrically coupled to the first metallization structure 110.

The plurality of fourth vias 158a and 158b are respectively coupled to the plurality of fourth interconnects 159a and 159b. The plurality of fourth interconnects 159a and 159b are respectively coupled to the plurality of solder balls 152.

The optional fifth portion 105 of the hybrid package 100 includes the optional third metallization structure 170. The optional third metallization structure 170 includes a plurality of fifth interconnects 172 (e.g., 172a, 172b) (e.g., pads and traces), a plurality of fifth vias 174, and a plurality of fifth dielectric layers 176.

The plurality of fifth interconnects 172 (e.g., 172b) is coupled to the optional plurality of through mold vias 164. That is, the plurality of fifth interconnects 172 electrically couples the third metallization structure 170 to the second metallization structure 140 by way of the through mold vias 164. Furthermore, the plurality of fifth interconnects 172 (e.g., 172a) electrically couples the third metallization structure 170 to the optional second package 199 in a package-on-package (POP) configuration.

FIG. 1C-1F illustrate various electrical paths through the hybrid package 100. These various electrical paths are exemplary and are not so limited.

Figure 1C:
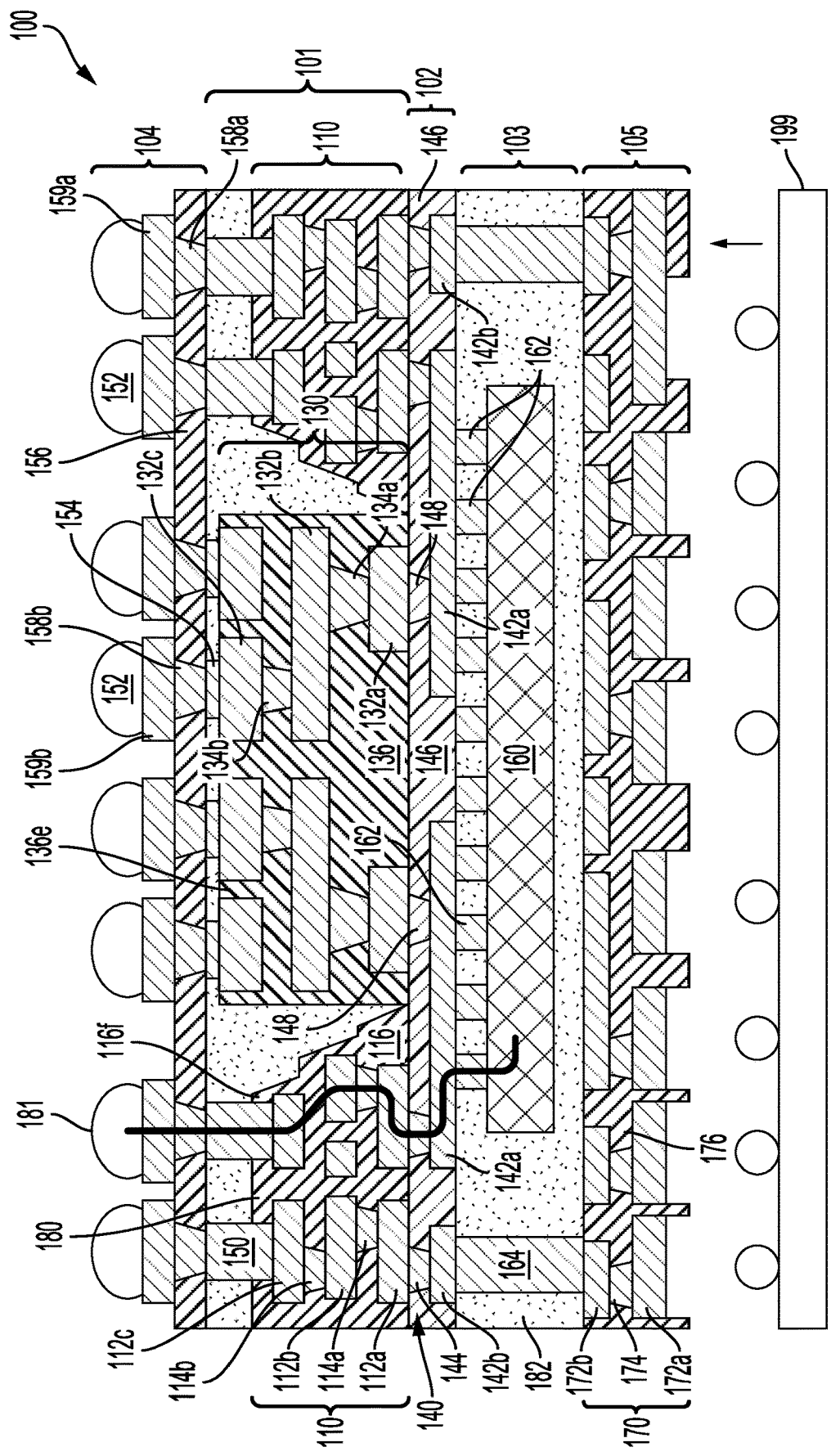
FIG. 1C-1F illustrate various electrical paths through the hybrid package.

FIG. 1C illustrates a first electrical path 181 from the die 160 through the first metallization structure 110 and through the plurality of solder balls 152. The first electrical path 181 may be configured to transmit a data signal. It shall be understood that the first electrical path 181 is operable in the reverse direction. The die 160, located in the third portion 103 of the hybrid package 100 is configured to send a data signal (or multiple data signals) along the following first electrical path 181: The die 160 transmits the data signal through the plurality of third interconnects 162 (e.g., flip chip bumps), through the plurality of second interconnects 142a, and through the plurality of second vias 144a of the second metallization structure 140.

The data signal continues from the plurality of second vias 144a through the plurality of first interconnects 112 (e.g., 112a, 112b, and 112c), through the plurality of first vias 114 (e.g., 114a and 114b), and through the plurality of sixth interconnects 150 of the first metallization structure 110. The data signal continues from the plurality of sixth interconnects 150 through the plurality of fourth vias 158a to the plurality of fourth interconnects 159*a* to the plurality of solder balls 152. The plurality of solder balls 152 are configured to be coupled to a PCB (not shown). Therefore, the data signal transmitted from the die 160 may be electrically transmitted from the die 160 through the solder balls 152 and to a coupled PCB (not shown).

It shall be understood that the first electrical path 181 also operates in the reverse direction. In other words, another data signal may be transmitted from another electrical component (not shown) to the PCB (not shown) through the plurality of solder balls 152, through the first metallization structure 110, through the second metallization structure 140 and to the die 160 as described in detail above.

Figure 1D:
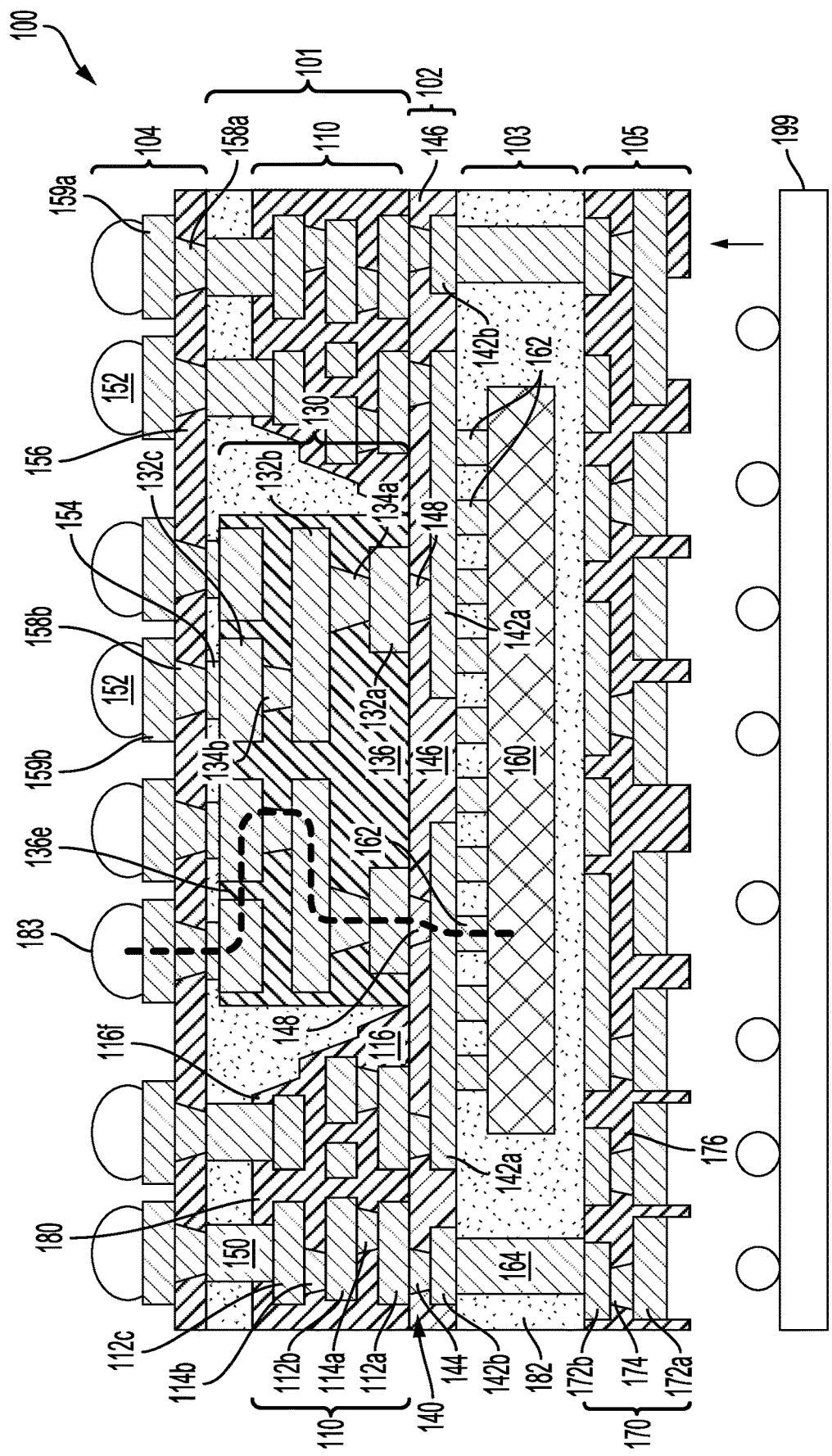

FIG. 1D illustrates a second electrical path 183 from the plurality of solder balls 152 to the die 160. The second electrical path 183 may be configured for transmitting power to the die 160 from the PCB (not shown, where the PCB may be coupled to a power source) that is coupled to the plurality of solder balls 152. The second electrical path 183 is as follows: Power is transmitted through the plurality of solder balls 152, through the plurality of fourth interconnects 158*b*, and 159*b*, through the plurality of seventh interconnects 154, through the plurality of substrate interconnects 132 (e.g., 132*a*, 132*b*, and 132*c*), through the plurality of substrate vias 134 (e.g., 134*a* and 134*b*) of the first substrate structure 130. The power then continues from the plurality of substrate interconnects 132 (e.g., 132*a*) through the plurality of solder interconnects 148, through the plurality of second interconnects 142*a*, through the third plurality of interconnects 162, and then to the die 160. The second electrical path 183 may operate in the reverse direction.

Figure 1E:
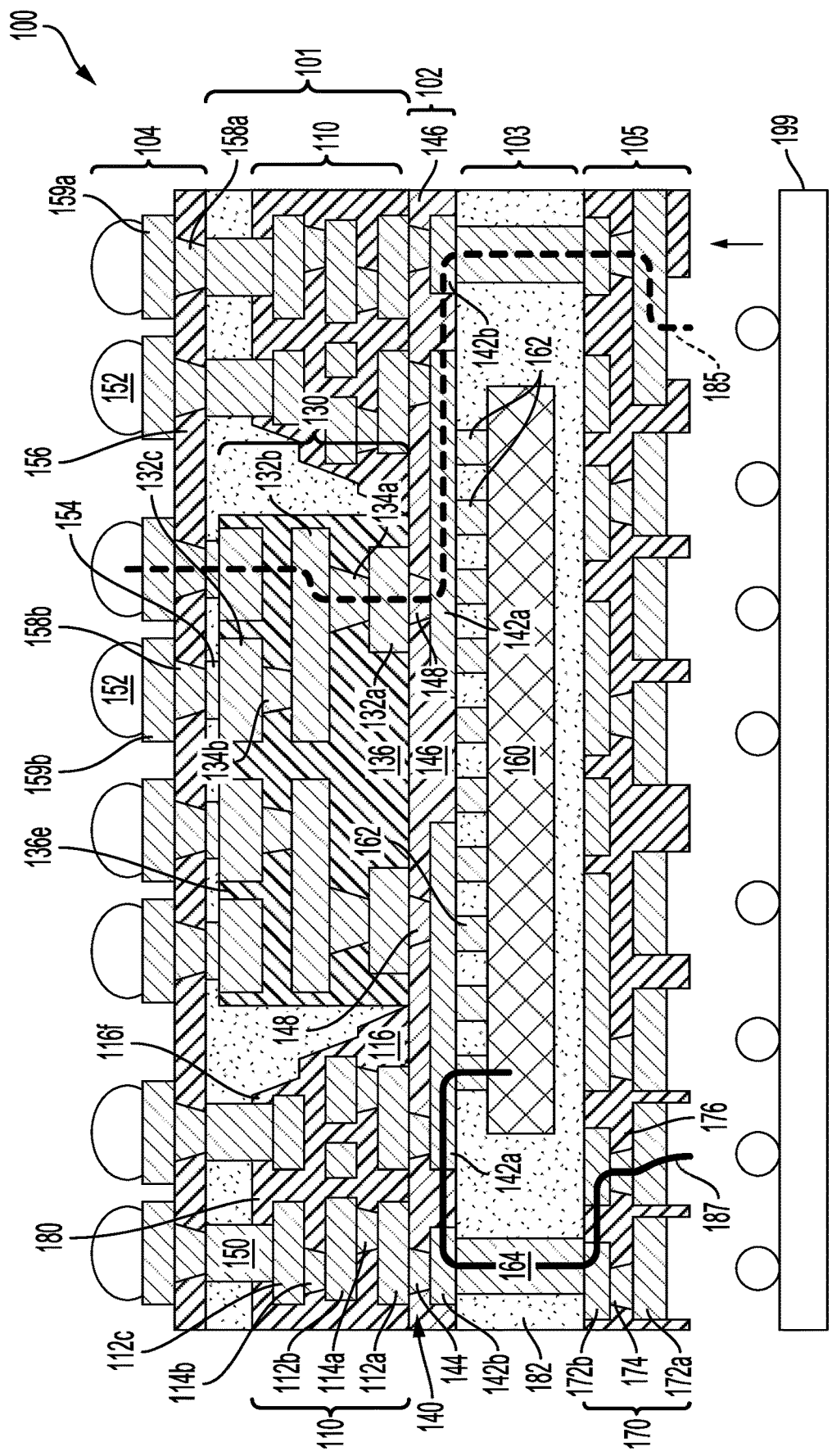

FIG. 1E illustrates a third electrical path 185 and a fourth electrical path 187.

The third electrical path 185 may be used to distribute power (e.g., power signal) from a PCB (not shown) coupled to the plurality of solder balls 152, to the optional second package 199 (e.g., POP package). The third electrical path 185 is as follows: Power is transmitted from the plurality of solder balls 152 through the plurality of fourth interconnects 158*b*, and 159, through the plurality of seventh interconnects 154, through the plurality of substrate interconnects 132 (e.g., 132*a*, 132*b*, and 132*c*), through the plurality of substrate vias 134 (e.g., 134*a* and 134*b*) of the first substrate structure 130. The power (e.g., power signal) then continues from the plurality of substrate interconnects 132 (e.g., 132*a*) through the plurality of solder interconnects 148, through the plurality of second interconnects 142*a*, through the plurality of second interconnects 142*b*, through the optional plurality of through mold vias 164 through the plurality of fifth interconnects 172 and plurality of fifth vias 174 to the optional second package 199. The electrical path 185 operates in the reverse direction.

The fourth electrical path 187 may be used to transmit a data signal from the die 160 to the optional second package 199. The fourth electrical path 187 is as follows: The data signal is transmitted from the die through the third plurality of interconnects 162, through the plurality of second interconnects 142*a*, through the plurality of second interconnects 142*b*, through the optional plurality of through mold vias 164, through the optional third metallization structure 170 (as described previously), to the second package 199. The fourth electrical path 187 may be operated in the reverse direction.

Figure 1F:
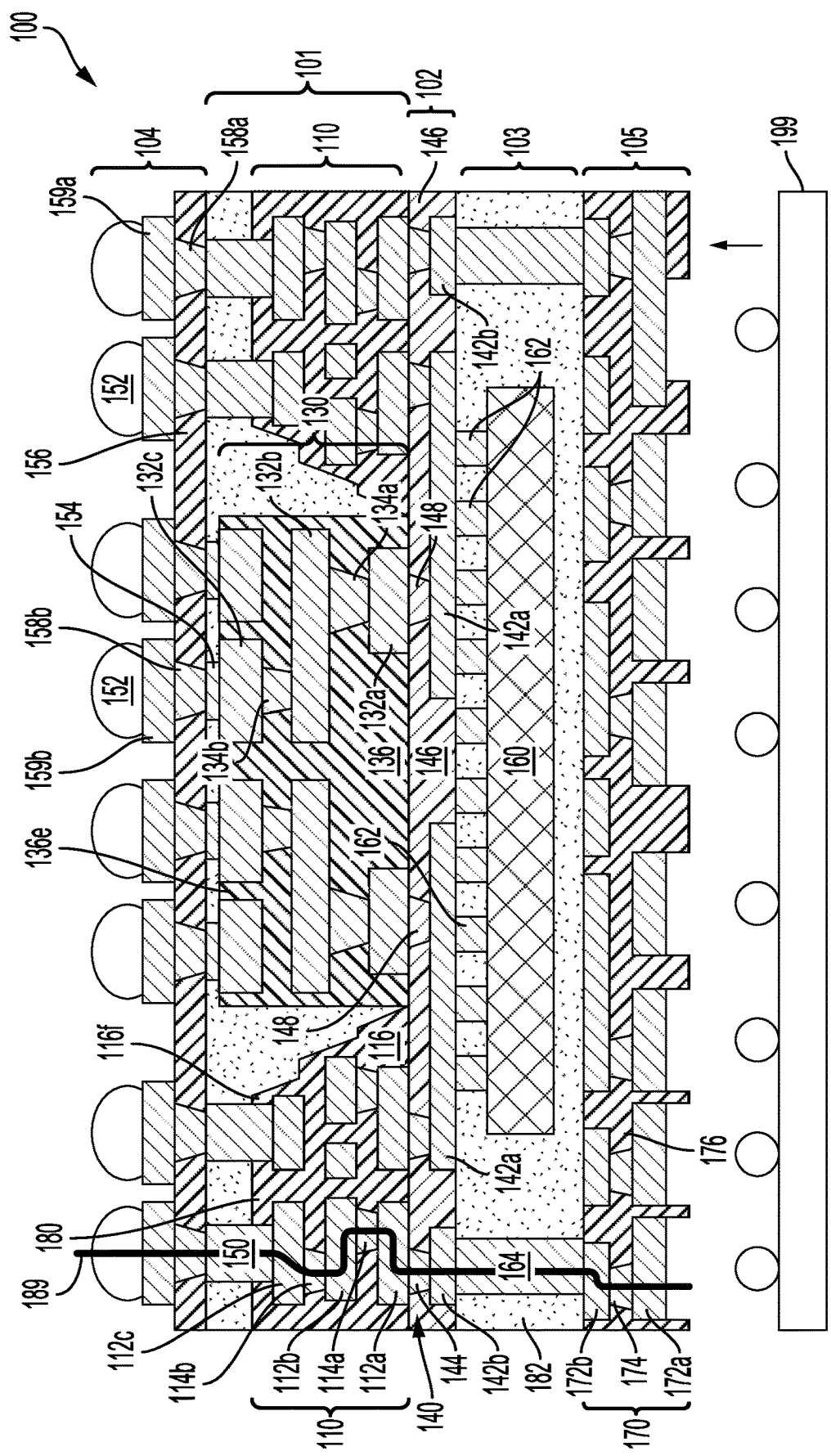

FIG. 1F illustrates a fifth electrical path 189 from the optional second package 199 through the first metallization structure 110 and through the plurality of solder balls 152. The fifth electrical path 189 may be configured to transmit a data signal. The fifth electrical path 189 is as follows: The data signal from the optional second package 199 may be transmitted through the plurality of fifth interconnects 172 (e.g., 172*a* and 172*b*), through the plurality of fifth vias 174, to the optional plurality of through mold vias 164, through the plurality of second interconnects 142*b* to the plurality of second vias 144 of the second metallization structure 140, through the plurality of first interconnects 112 (e.g., 112*a*, 112*b*, and 112*c*), and through the plurality of first vias 114 (e.g., 114*a* and 114*b*) of the first metallization structure 110. The data signal would then continue to the plurality of fourth vias 158*a*, to the plurality of fourth interconnects 159*a* and then to the plurality of solder balls 152. The plurality of solder balls 152 are configured to be coupled to a PCB (not shown), therefore the signal transmitted from the optional second package 199 may be electrically transmitted through the solder balls 152 and to a coupled PCB (not shown).

Other electrical paths are included as would be understood by a person of skill in the art. It shall also be understood that the various electrical paths may be utilized at the same time. For example, the die 160 may be receiving power from the second electrical path 183, at the same time data signaling is being transmitted through the first electrical path 181 or through the fourth electrical path 187, or through the fifth electrical path 189.

Figure 2:
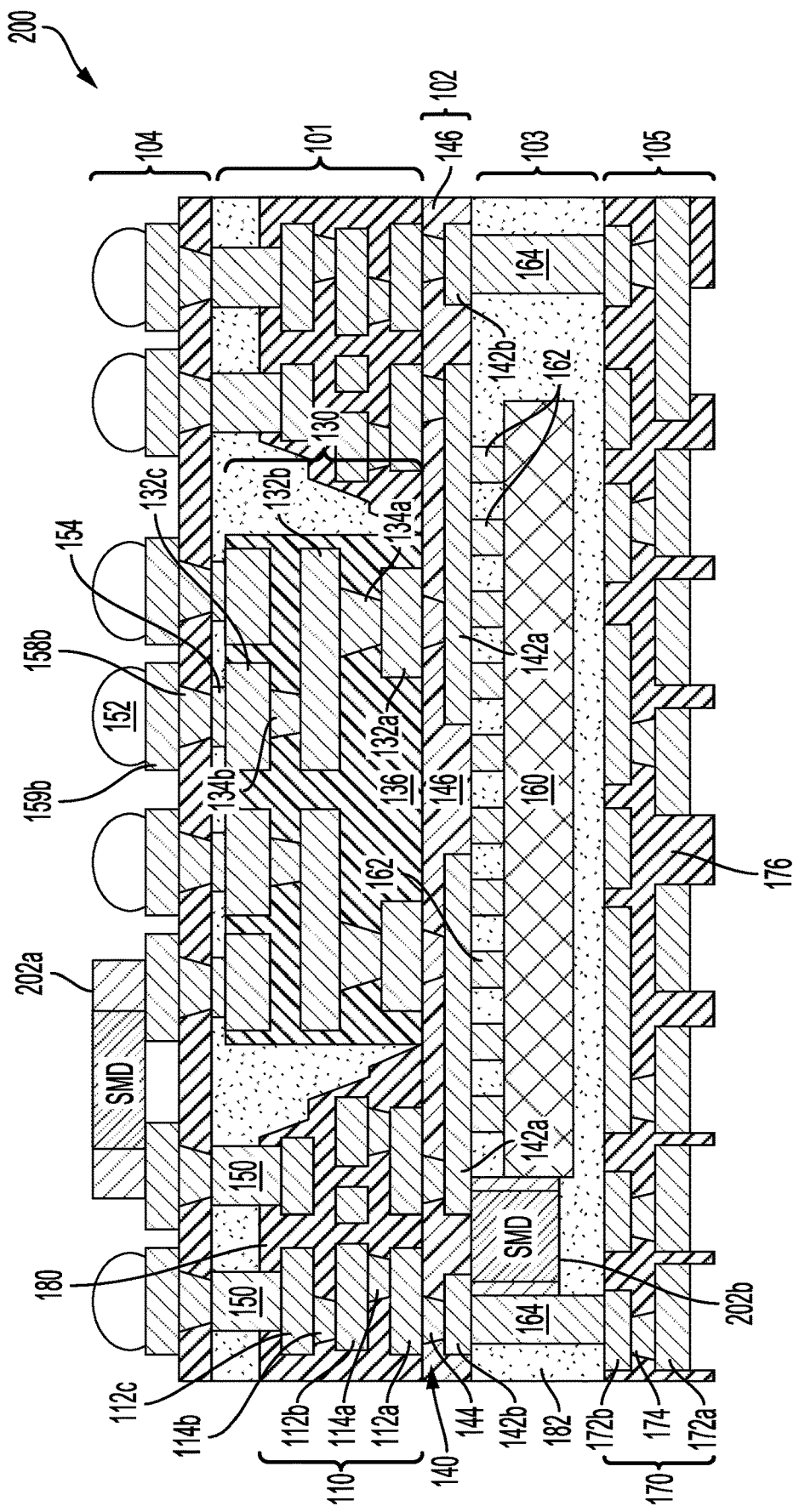
FIG. 2 illustrates the hybrid package of FIGS. 1A and 1B with surface mount devices.

FIG. 2 illustrates the hybrid package of FIGS. 1A and 1B with surface mount devices. Specifically, FIG. 2 illustrates the hybrid package 200 that is like the hybrid package 100, except that the hybrid package 200 includes surface mount devices 202*a* and 202*b*. The surface mount devices 202*a* and 202*b* may be any passive component such as an inductor, a capacitor, or a resistor. The surface mount devices 202*a* and 202*b* may be the same type of surface mount device (e.g., both may be an inductor) or they may be different (e.g., 202*a* may be an inductor and 202*b* may be a capacitor).

The surface mount device 202*a* may be located in place of select solder balls 152 in the fourth portion 104 of the hybrid package 200. The surface mount device 202*a* may be electrically coupled to the plurality of fourth interconnects 159*a* and 159*b* of the fourth portion 104, and therefore electrically coupled to the die 160 through the first metallization structure 110 or through the first substrate structure 130. That is, one electrode of the surface mount device 202*a* may be located on one of the fourth interconnects 159*a* of the plurality of fourth interconnects, and another electrode of the surface mount device 202*a* may be located on another of the fourth interconnects 159*b* of the plurality of fourth interconnects The surface mount device 202*b* may be located in the third portion 103 of the hybrid package 200. Specifically, the surface mount device 202*b* may be embedded in the second mold 182 of the third portion 103. The surface mount device 202*b* may be electrically coupled to the plurality of second interconnects 142 (e.g., 142*a* and 142*b*).

Although not illustrated, the hybrid package 200 may be coupled to a second package 199 (illustrated in FIG. 1A).

An advantage of the surface mount device 202*a* and 202*b* is that they do not require additional area in the hybrid package 200.

Figure 3:
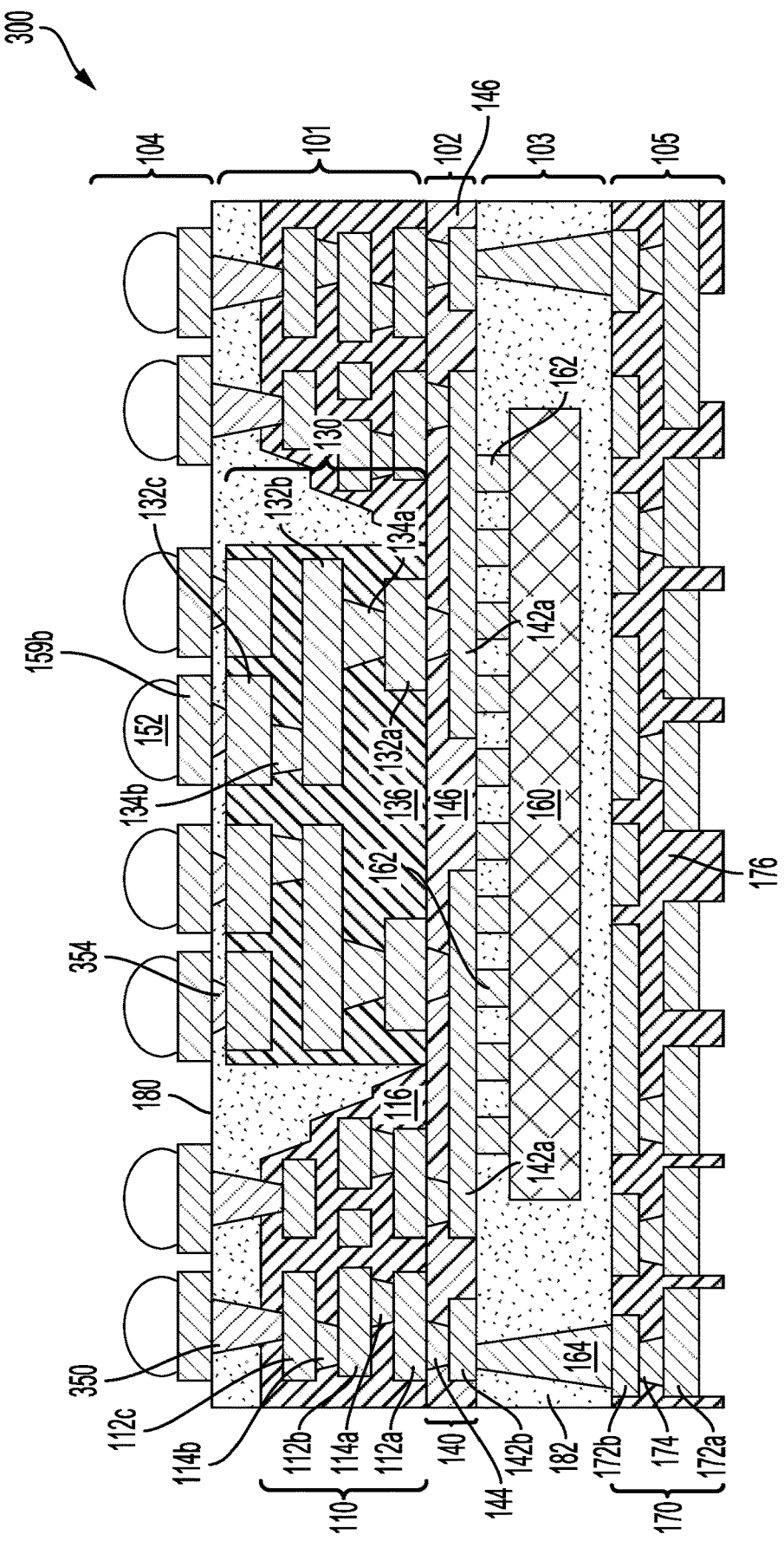
FIG. 3 illustrates cross-section view of another hybrid package.

FIG. 3 illustrates cross-section view of another hybrid package 300 including a metallization structure and a substrate. FIG. 3 is like FIG. 1A, except for the following: FIG. 3 illustrates a plurality of sixth interconnects 350 in the first metallization structure 110, and a plurality of seventh interconnects 354 in the first substrate structure 130. The plurality of sixth interconnects 350 are through mold vias formed in the first mold 180 that are directly coupled to the plurality of fourth interconnects 159a (e.g., pads or traces). The plurality of seventh interconnects 354 are through mold vias formed in the first mold 180 (instead of copper pillars) that are directly coupled to the plurality of interconnects 159b. Therefore, the plurality of fourth vias 158a, and 158b of FIG. 1A are omitted in this embodiment. Also, the plurality of sixth interconnects 150 and the dielectric layer 156 of FIG. 1A are omitted in this embodiment.

In contrast, FIG. 1A illustrates the plurality of seventh interconnects 154 directly coupled to the plurality of fourth vias 158b.

Figure 4:
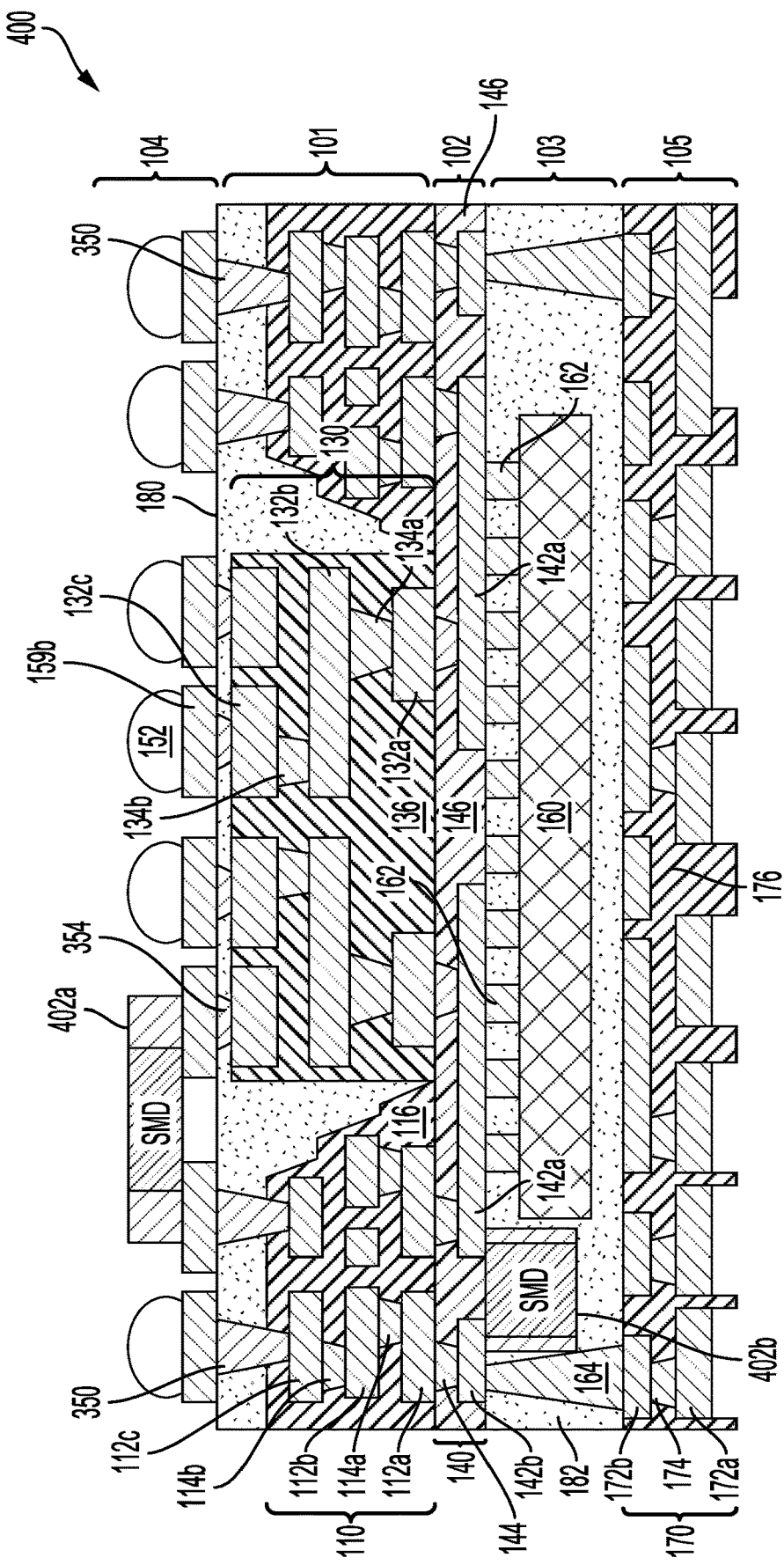
FIG. 4 illustrates the hybrid package of FIG. 3 with surface mount devices.

FIG. 4 illustrates the hybrid package of FIG. 3 with surface mount devices. Specifically, FIG. 4 illustrates a hybrid package 400 (like hybrid package 300) including surface mount devices 402a and 402b. The surface mount devices 402a and 402b may be any passive component such as an inductor, a capacitor, or a resistor. The surface mount devices 402a and 402b may be the same type of surface mount device (e.g., both may be an inductor) or they may be different (e.g., 402a may be an inductor and 402b may be a capacitor).

The surface mount device 402a may be located in place of select solder balls 152 in the fourth portion 104 of the hybrid package 100. The surface mount device 402a may be electrically coupled to the plurality of fourth interconnects 159a and 159b of the fourth portion 104, and therefore electrically coupled to the die 160 through the first metallization structure 110 or through the first substrate structure 130.

The surface mount device 402b may be located in the third portion 103 of the hybrid package 100. Specifically, the surface mount device 402b may be embedded in the second mold 182 of the third portion 103. The surface mount device 402b may be electrically coupled to the plurality of second interconnects 142 (e.g., 142a and 142b).

Exemplary Sequence for Manufacturing a Hybrid Package

In some implementations, manufacturing a hybrid package includes several processes. FIGS. 5A-5K illustrate a sequence of manufacturing process steps to manufacture the hybrid package 100 of FIGS. 1A and 1B. FIGS. 6A-6I illustrate a sequence of manufacturing process steps to manufacture the hybrid package 300 of FIG. 3.

FIG. 5A-K will now be described in the context of manufacturing the hybrid package that includes the plurality of interconnects 150 (e.g., copper pillar) of FIG. 1A. It should be noted that the sequence of FIG. 5A-K may combine one or more stages to simplify and/or clarify the sequence. In some implementations, the order of the processes may be changed or modified.

Figure 5A:
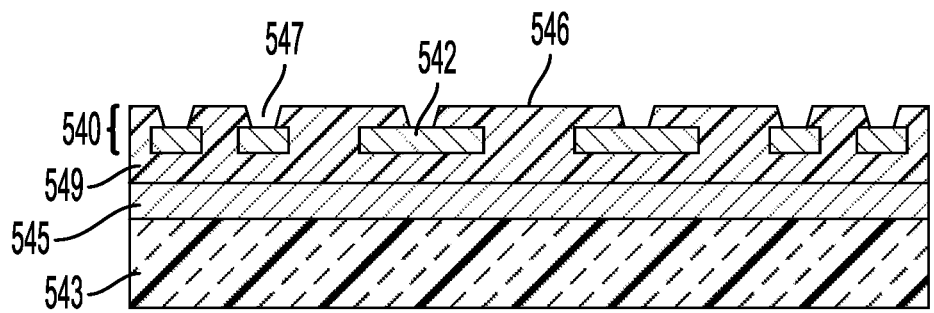
FIGS. 5A-5K illustrate a sequence of manufacturing process steps to manufacture the hybrid package of FIG. 1A and FIG. 1B.

FIG. 5A illustrates a first carrier 543 that is detachable. The first carrier 543 may be provided by a supplier or manufactured. An adhesive layer 545 is formed on and over the first carrier 543 so that a passivation layer 549 may be attached to the first carrier 543 through the adhesive layer 545. The passivation layer 549 is formed over the adhesive layer 545. The passivation layer 549 is selected to provide electrical isolation and to act as a physical barrier. The passivation layer 549 may include any of the following materials, but is not so limited: a temporary film which is detachable by UV or chemical action, or a double layer film structure that includes both UV and an adhesive layer.

A second metallization structure 540 is formed over the passivation layer 549, adhesive layer 545, and first carrier 543. The second metallization structure 540 includes a plurality of dielectric layers 546, and a plurality of metal interconnects 542. The plurality of dielectric layers 546 are formed over the passivation layer 549. The plurality of metal interconnects 542 are formed (e.g., patterned) in the plurality of dielectric layers 546. The plurality of metal interconnects 542 may be formed by any known methods. The plurality of metal interconnects 542 may include pads or traces or both. A plurality of holes 547 are formed in the topmost dielectric layer of the plurality of dielectric layers 546. The second metallization structure 540 is a second portion 502 of the hybrid package 500.

The material for the plurality of dielectric layers 546 are selected to provide electrical isolation. The material for the plurality of dielectric layers 546, and for any other dielectric layers (e.g., dielectric layers, plurality of first dielectric layers, plurality of second dielectric layers, etc.) mentioned herein within this document unless stated otherwise, may include, but are not so limited: a photo sensitive dielectric which may be polymide, PBO, or epoxy based. The material for the plurality of interconnects 542, and for any other interconnects (e.g., plurality of first interconnects, plurality of second interconnects, etc.) mentioned herein within this document unless stated otherwise, may include copper, but are not so limited.

Figure 5B:
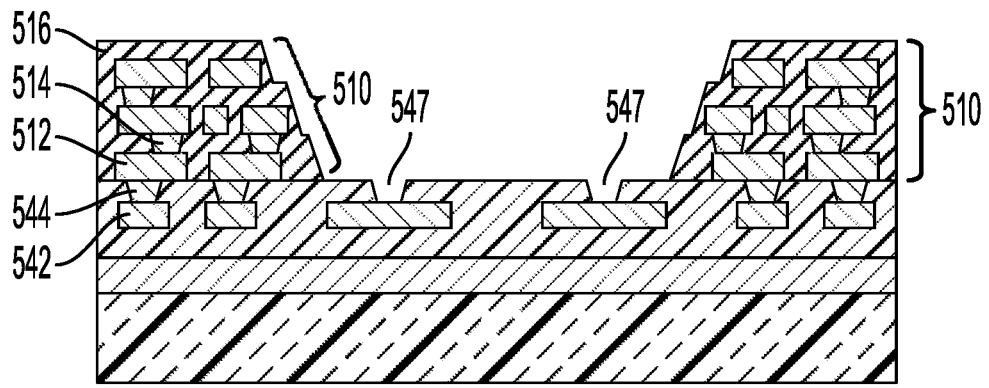

FIG. 5B illustrates a first metallization structure 510 formed over and on the second metallization structure 540. The first metallization structure 510 may be formed such that it is circular or rectangular or any other shape which leaves an opening or a space in between or in the center of the first metallization structure 510 (e.g., refer to FIG. 1B illustrating an opening in the first metallization structure 110 filled by the first substrate structure 130).

The first metallization structure 510 includes a plurality of dielectric layers 516, a plurality of metal interconnects 512, and a plurality of vias 514 (e.g., a plurality of first vias 114). The plurality of metal interconnects 512 are formed in the plurality of dielectric layers 516. The plurality of metal interconnects 512 and the plurality of vias 514 may be formed by any known methods (e.g., forming dielectric layer, forming cavities in the dielectric layer, seeding a metal layer, plating the metallization structure 510).

The first metallization structure 510 is coupled to the second metallization structure 540 through a plurality of vias 544 in the second metallization structure 540.

Figure 5C:
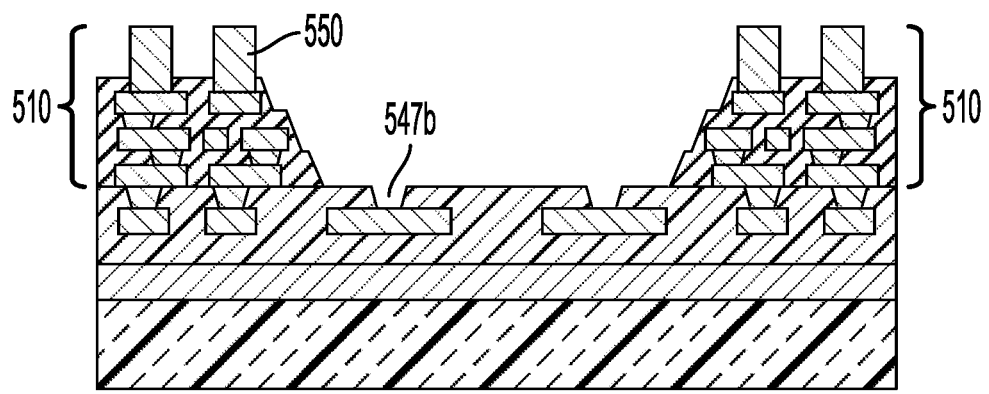

FIG. 5C illustrates a plurality of metal interconnects 550 are formed. The plurality of metal interconnects 550 are formed on, and coupled to a topmost first interconnect of the plurality of first interconnects 512. The plurality of metal interconnects 550 may be a copper pillar, or a pillar, or cylindrical bump.

Figure 5D:
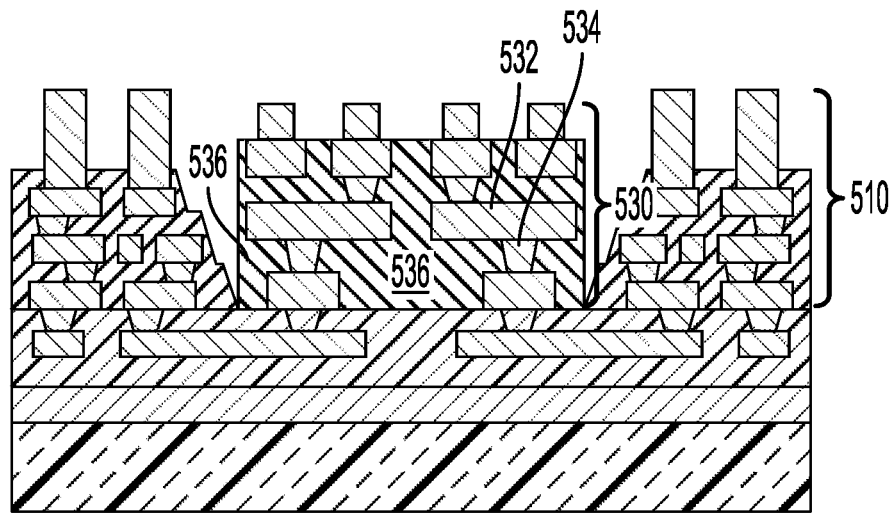

FIG. 5D illustrates a first substrate structure 530 formed over and on the second metallization structure 540. The first substrate structure 530 is formed such that the first metallization structure 110 at least partially surrounds or fully surrounds the first substrate structure 530. The first substrate structure 530 is formed in the opening or space in between or in the center of the first metallization structure 510. The first substrate structure 530 is coupled to the second metallization structure 540 through a plurality of solder connects 548 formed in the plurality of holes 647b.

A plurality of substrate dielectric layers 536 are formed. A plurality of substrate interconnects 532 (e.g., metal interconnects) are formed in the plurality of substrate dielectric layers 536. A plurality of substrate vias 534 couple the plurality of substrate interconnects 532 that are formed in separate layers of the plurality of substrate dielectric layers 536. A plurality of metal interconnects 554 are formed on a topmost layer of the plurality of substrate interconnects 532.

The first substrate structure 530 is formed to be at least partially coplanar with the first metallization structure 510, on a horizontal plane, and is adjacent to the first metallization structure 510. In one aspect, the topmost portion of the first metallization structure 510 is not coplanar with the topmost portion of the first substrate structure 530, but other portions of the first metallization structure 510 are coplanar with the first substrate structure 530. In one aspect, the topmost portion of the first metallization structure 510 is the topmost dielectric layer of the plurality of first dielectric layers 516, and the topmost portion of the first substrate structure 530 is the topmost substrate dielectric layer of the plurality of substrate dielectric layers 536 As used here, the term topmost does not include the top interconnects, such as the plurality of metal interconnects 550 of the first metallization structure 510 or the plurality of metal interconnects 554 of the first substrate structure 530, as these metal interconnects (e.g., 550 and 554) may be coplanar relative to each other.

Figure 5E:
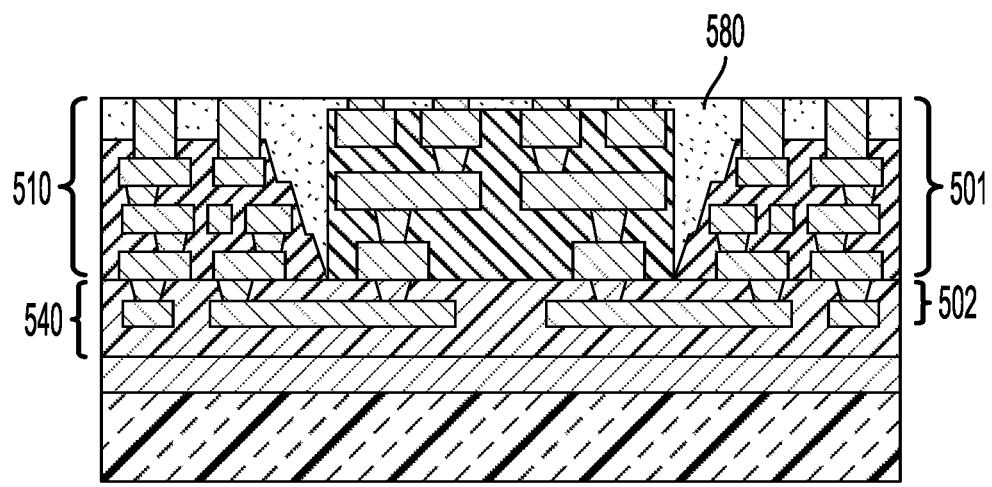

FIG. 5E illustrates a first mold 580 (e.g., the first mold 180). The first mold 580 may be any mold encapsulant (e.g., thermoset resin), but is not so limited. The first mold 580 is formed such that it at least partially surrounds the first metallization structure 510 and the first substrate structure 530. The first mold 580 physically separates, and electrically insulates the first metallization structure 510 and the first substrate structure 530 from each other. The first mold 580 provides structural support for the first metallization structure 510 and the first substrate 530.

Together, the first metallization structure 510, the first substrate structure 530, and the first mold 580 form a first portion 501 of a hybrid package 500.

Figure 5F:
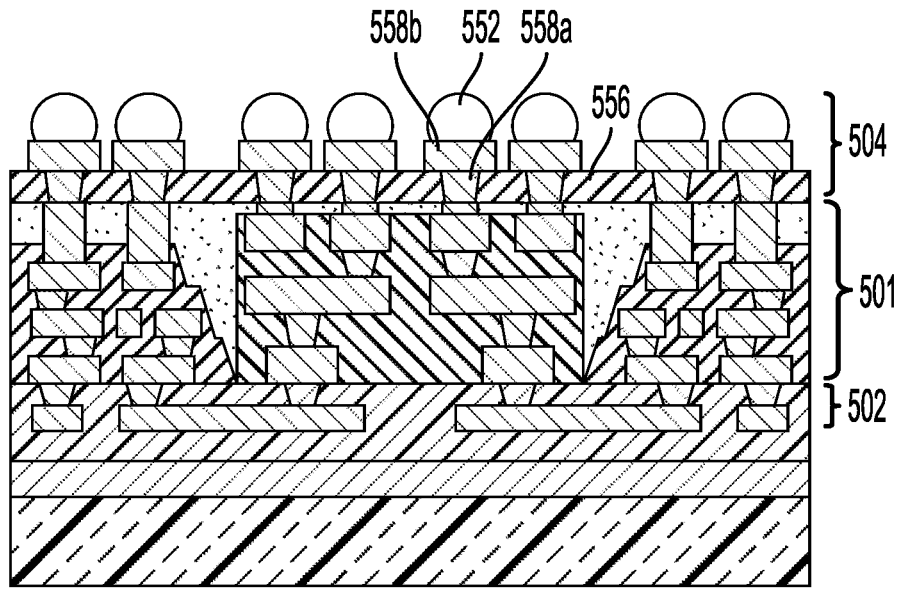

FIG. 5F illustrates the formation of a fourth portion 504 of the hybrid package 500. At least one dielectric layer 556 is formed over the first portion 501. A plurality of metal interconnects 558 are formed, including a plurality of vias 558a are formed in the at least one dielectric layer 556, and a plurality of metal interconnects 558b (e.g., pads) are formed over the at least one dielectric layer 556. A plurality of solder balls 552 are formed on the plurality of metal interconnects 558b, such that some of the solder balls 552 are electrically coupled to the plurality of interconnects 550 of the first metallization structure 510, and some of the plurality of metal interconnects 558b are electrically coupled to the plurality of interconnects 554 of the first substrate structure 530.

Figure 5G:
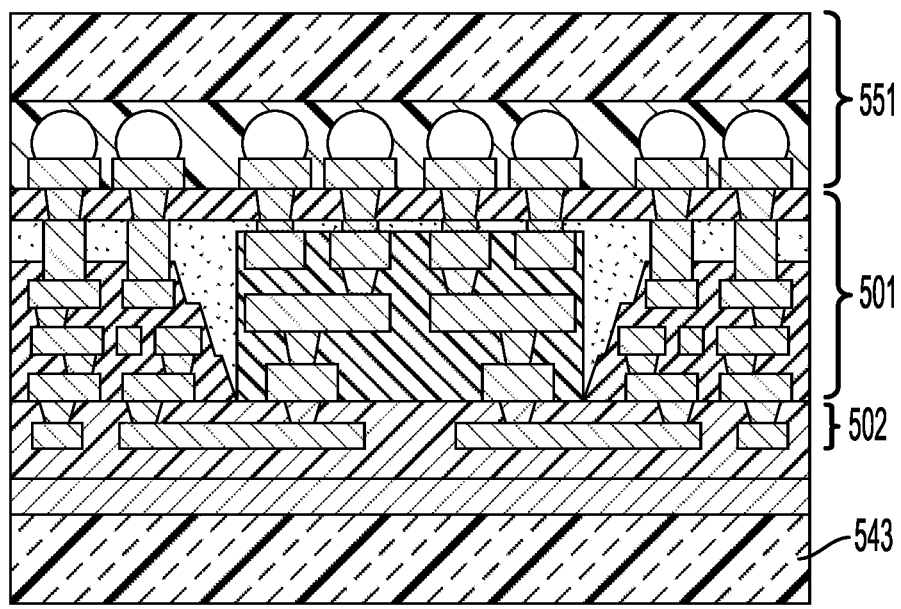

FIG. 5G illustrates a second carrier 551 formed over the fourth portion 504.

Figure 5H:
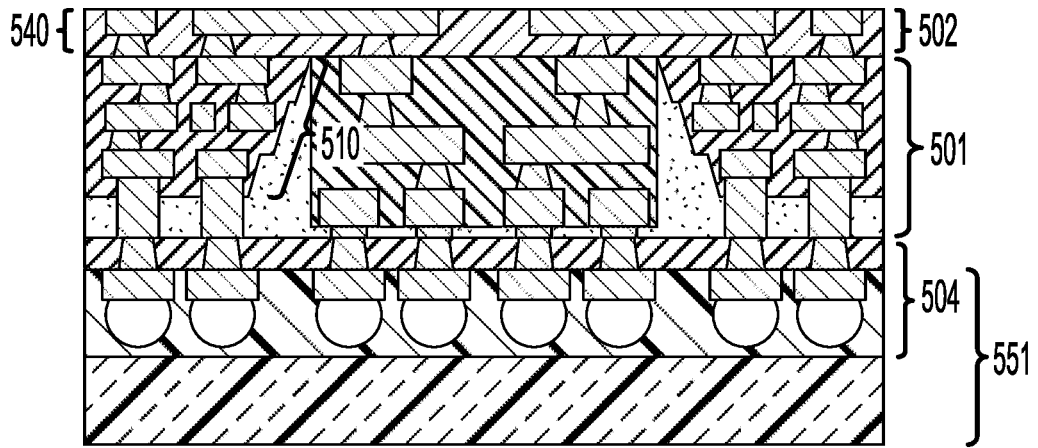

FIG. 5H illustrates FIG. 5F after being flipped over and after the first carrier 543 is removed so that the second metallization 540 is exposed.

Figure 5I:
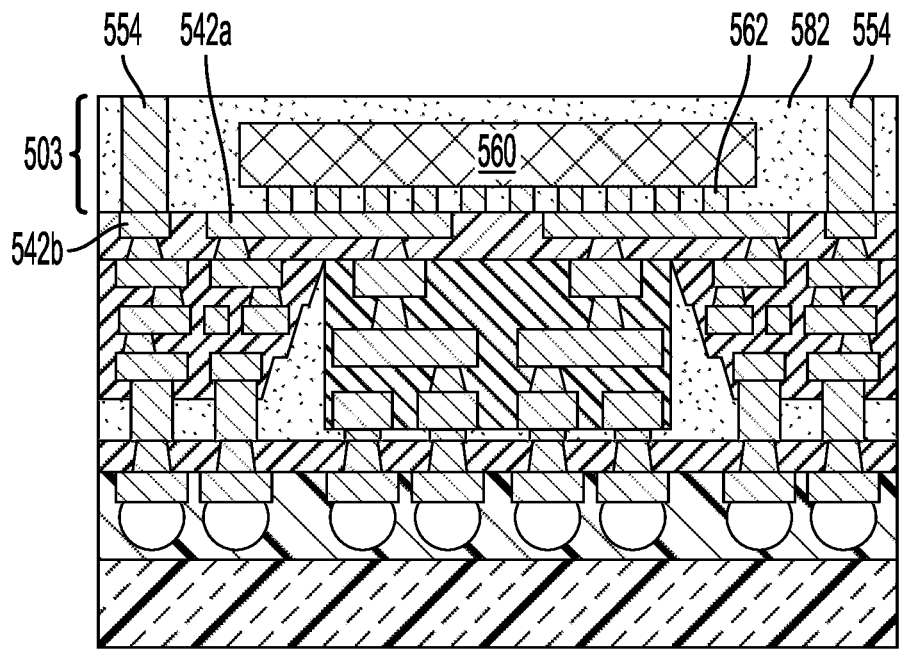

FIG. 5I illustrates formation of a third portion 503 of the hybrid package 500. The third portion includes a die 560. The die 560 is coupled to the plurality of interconnects 542a of the second metallization 540 through a plurality of metal interconnects 562. The plurality of metal interconnects 562 may be flip chip bumps and the die 560 may be a flip chip die. If the hybrid package 500 is desired to be coupled to a second package 599 (see FIG. 5K) in a package-on-package (PoP) configuration, then optional through mold vias 564 are formed and coupled to the plurality of metal interconnects 542b of the second metallization structure 540.

A second mold 582 is formed over and at least partially surrounding the die 560, the plurality of metal interconnects 562 (e.g., flip chip bumps), and the through mold vias 564.

Figure 5J:
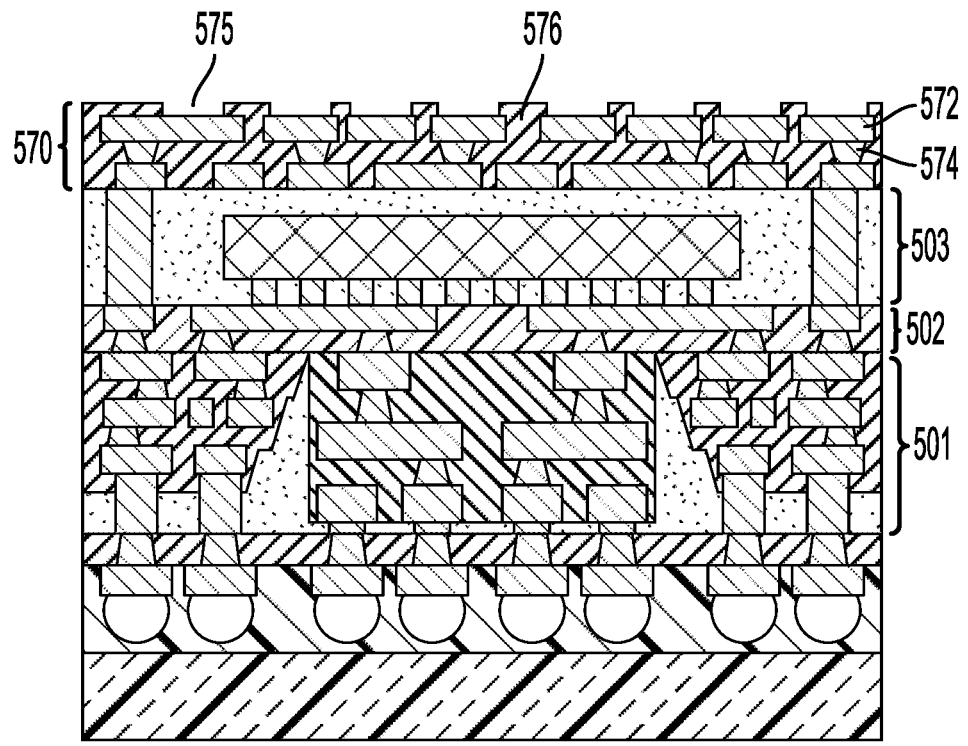

FIG. 5J illustrates an optional third metallization structure 570 formed over the third portion 503 of the hybrid package 500. The optional third metallization structure 570 provides additional metal layers for connecting the hybrid package 500 to a second package 599 in a PoP configuration.

The third metallization structure 570 includes forming a plurality of dielectric layers 576 (e.g., plurality of fifth dielectric layers 176). A plurality of metal interconnects 572 are formed in the plurality of dielectric layers 576. A plurality of vias 574 couple the plurality of metal interconnects 572 that are formed in separate layers of the plurality of dielectric layers 576. A plurality of holes 575 are formed over the topmost plurality of metal interconnects 572 (e.g., 527a) so that if desired, the optional second package 599 (see FIG. K) can be coupled to the third metallization structure 570 by any known methods (e.g., solder balls, metal interconnects) in a PoP configuration.

Figure 5K:
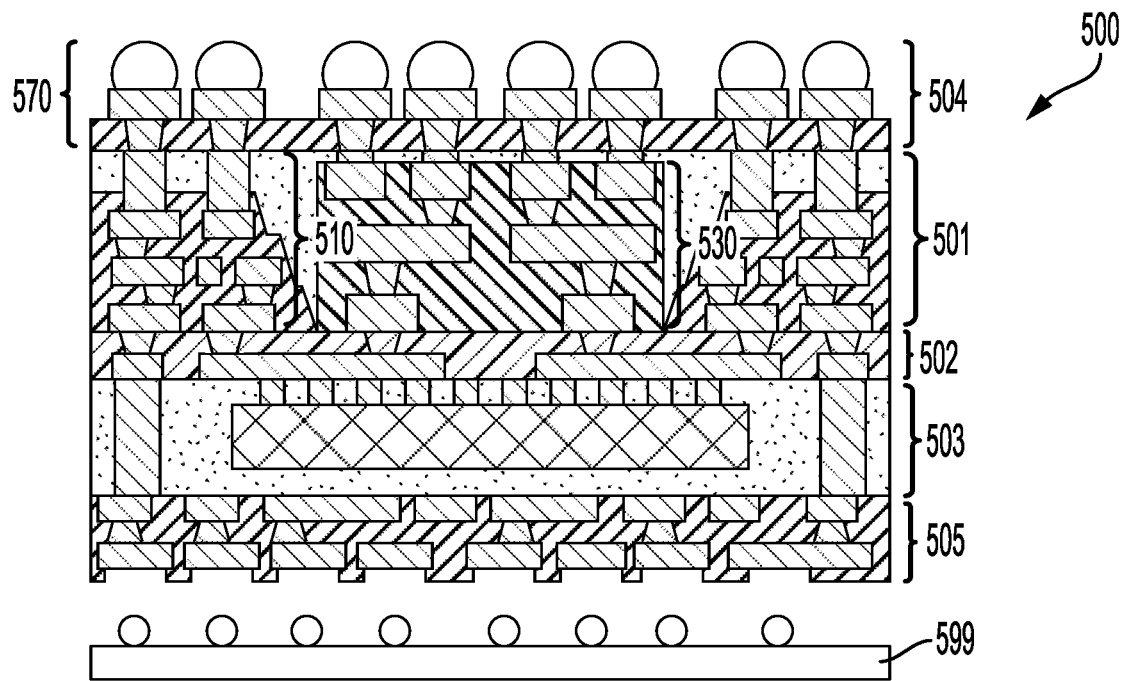

FIG. 5K illustrates FIG. 5J after it has been flipped over and the second carrier 551 has been removed. FIG. 5K illustrates the hybrid package 500 including the first portion 501, the second portion 502, the third portion 503, the fourth portion 504, and the optional fifth portion 505.

FIG. 5K further illustrates that the hybrid package 500 can be coupled to a second package 599.

FIGS. 6A-6l illustrate a sequence of manufacturing process steps to manufacture the hybrid package 300 of FIG. 3. FIG. 6A-6l will now be described in the context of manufacturing a hybrid package 600 that includes a plurality of metal interconnects 650 and another plurality of metal interconnects 354 that are respectively, through mold vias. It should be noted that the sequence of FIG. 6A-6l may combine one or more stages to simplify and/or clarify the sequence. In some implementations, the order of the processes may be changed or modified.

Figure 6A:
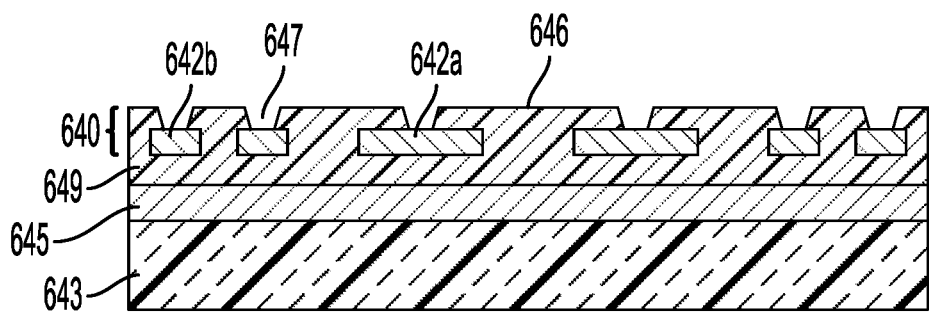
FIGS. 6A-6I illustrate a sequence of manufacturing process steps to manufacture the hybrid package of FIG. 3.

FIG. 6A is like FIG. 5A and therefore for brevity, the details of FIG. 6A can be found in the description for FIG. 5A. FIG. 6A includes a first carrier 643, an adhesive layer 645, a passivation layer 649, a second metallization structure 640 including a plurality of dielectric layers 646, a plurality of holes 647, and a plurality of metal interconnects 642 (e.g., 642a and 642b).

Figure 6B:
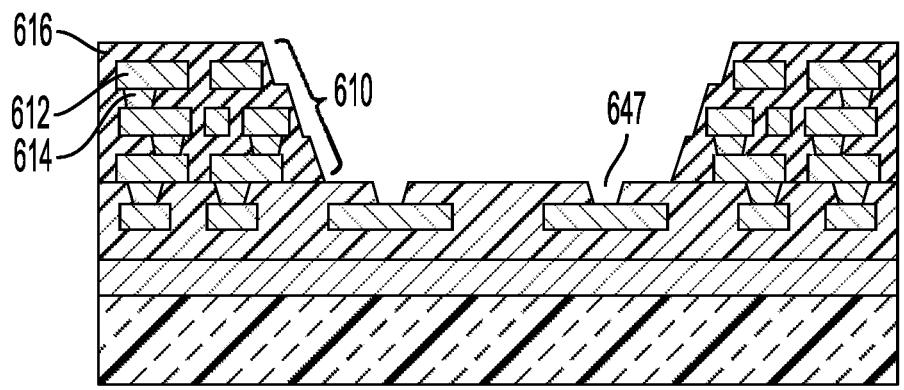

FIG. 6B is like FIG. 5B and therefore for brevity, the details of FIG. 6B can be found in the description for FIG. 5A. FIG. 6B includes a plurality of vias 644, a plurality of holes 647, a first metallization structure 610 including a plurality of dielectric layers 616, a plurality of metal interconnects 612, and a plurality of vias 614.

Figure 6C:
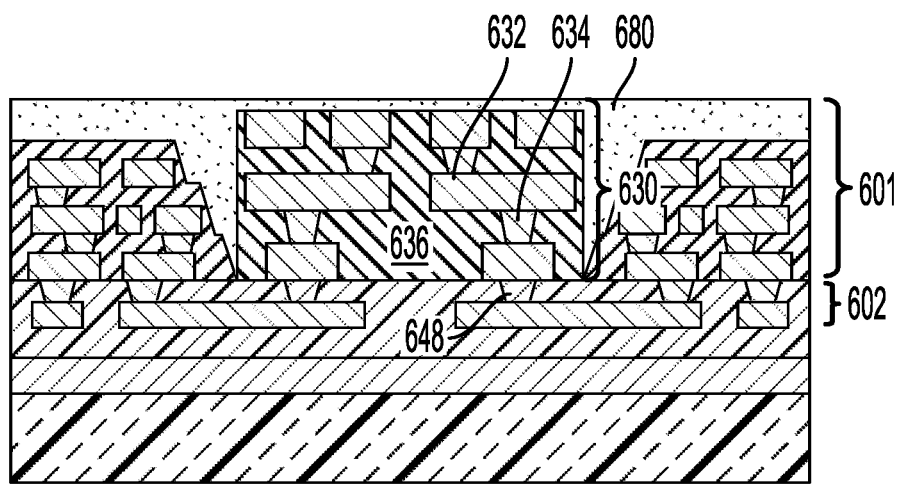

FIG. 6C is like FIGS. 5D and 5E combined, except that FIG. 6C does not have the plurality of metal interconnects 550 as shown in FIGS. 5D and 5E. Therefore, for brevity, the details of FIG. 6C can be found in the descriptions for FIG. 5D and FIG. 5E except for the above mentioned difference.

FIG. 6C includes a first substrate structure 630 formed over and on the second metallization structure 640 and in between the first metallization structure 610. FIG. 6C includes a plurality of substrate dielectric layers 636, a plurality of substrate interconnects 632 (e.g., metal interconnects), a plurality of substrate vias 634, and a plurality of solder interconnects 648 for electrically coupling the first substrate structure 630 to the second metallization structure 640. After the first substrate structure 630 is formed, a first mold 680 is formed over and at least partially surrounds the first substrate structure 630 and the first metallization structure 610.

Together, the first metallization structure 610, the first substrate structure 630, and the first mold 680 form a first portion 601 of a hybrid package 600. The second metallization structure 640 forms a second portion 602 of the hybrid package 600.

Figure 6D:
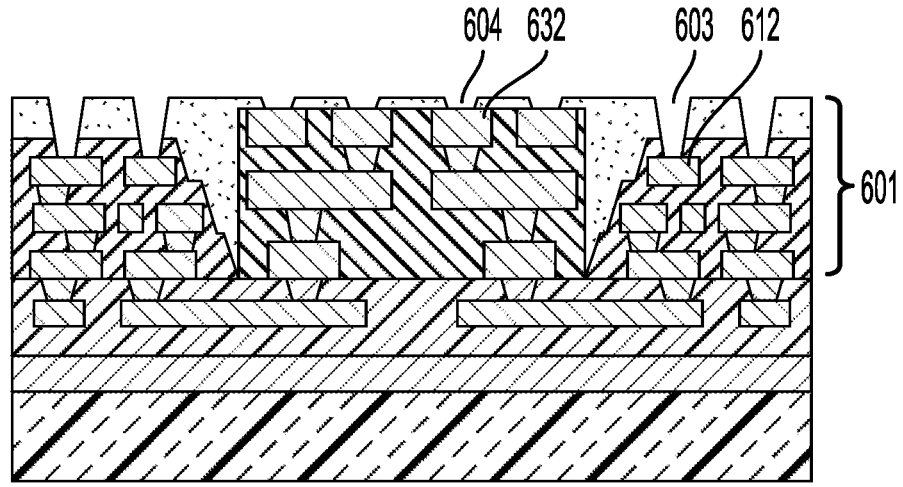

FIG. 6D illustrates holes 603 formed in the first mold 680. The holes 603 expose the plurality of metal interconnects 612 (specifically the topmost interconnects of the plurality of metal interconnects 612) in the first metallization structure 610. FIG. 6D further illustrates holes 603 that expose the plurality of substrate interconnects 632 (specifically the topmost substrate interconnects) of the plurality of substrate interconnects 632.

Figure 6E:
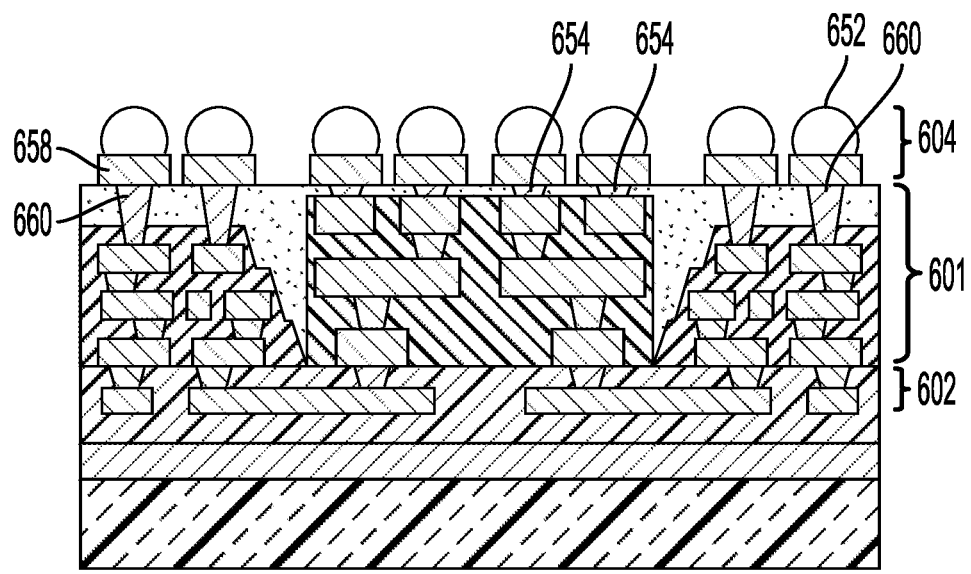

FIG. 6E illustrates the holes 603 filled in with a conductive material such as metal, thereby forming a plurality of through mold vias 660. The plurality of through mold vias 660 are electrically and physically in contact with the plurality of interconnects metal 612 of the first metallization structure 610. Furthermore, the holes 604 are filled in with a conductive material such as metal, thereby forming a plurality of through mold vias 654. The plurality of through mold vias 654 are electrically and physically in contact with the plurality of interconnects 632 of the first substrate structure 630.

FIG. 6E further illustrates a plurality of metal interconnects 658 (e.g., pads or traces) formed over the first mold 680 and over the through mold vias 660 and over the through mold vias 654. A plurality of solder balls 652 are formed on the plurality of metal interconnects 658 for electrical connection to a PCB (not shown). Together, the plurality of metal interconnects 658, and the plurality of solder balls 652 form a fourth portion of the hybrid package 600.

Figure 6F:
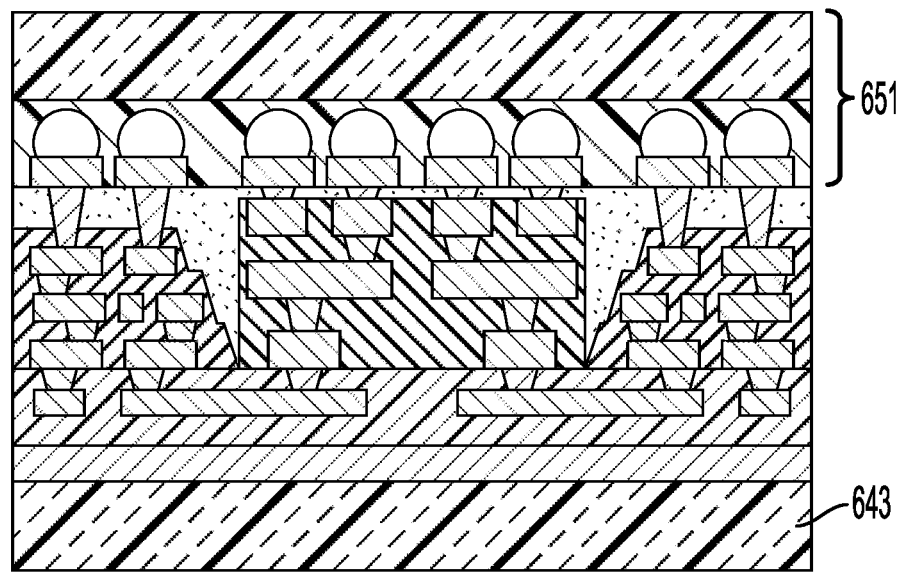

FIG. 6F illustrates a detachable second carrier 651 placed over the structure illustrated in FIG. 6E.

Figure 6G:
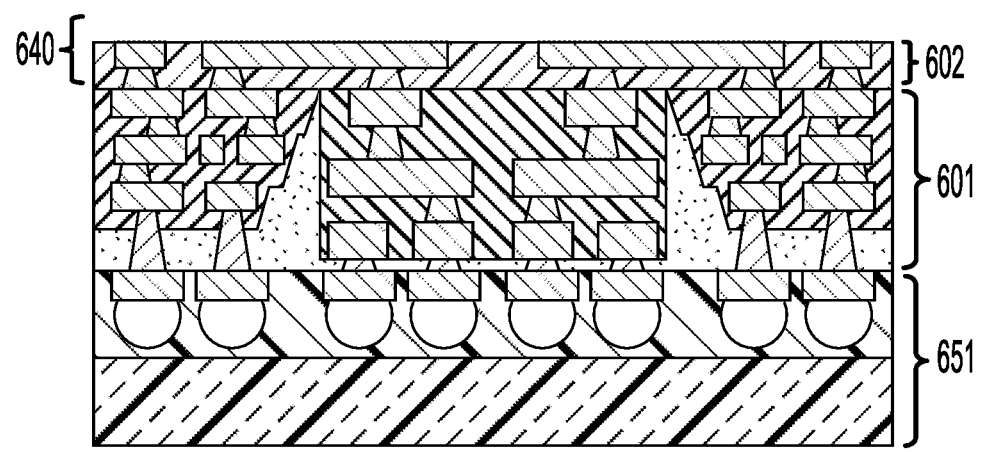

FIG. 6G illustrates the structure of FIG. 6F after the first carrier 643 is removed and the structure is flipped over so that the second metallization structure 640 is facing upwards.

Figure 6H:
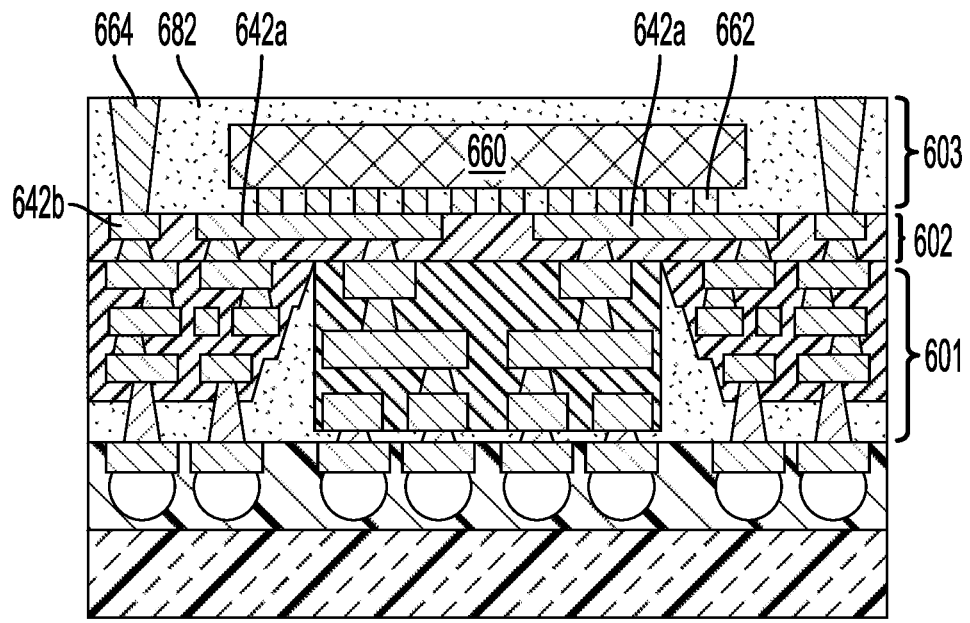

FIG. 6H illustrates the structure of FIG. 6G after formation of a third portion 603. The third portion 603 includes a die 660. The die 660 is coupled to the plurality of interconnects 642a of the second metallization 640 through a plurality of metal interconnects 662. The plurality of metal interconnects 662 may be flip chip bumps and the die 660 may be a flip chip die. A second mold 682 is formed over the die 660 and over the second metallization structure 640.

If the hybrid package 600 is desired to be coupled to a second package (not shown) in a package-on-package (PoP) configuration, then optional through mold vias 664 are formed and coupled to the plurality of metal interconnects 642b of the second metallization structure 640. The through mold vias 664 are formed by making holes or cavities in the second mold 682 and filling the holes with conductive material such as metal. The second mold 682 at least partially surrounds the die 660, the plurality of metal interconnects 662 (e.g., flip chip bumps), and the through mold vias 664.

Figure 6I:
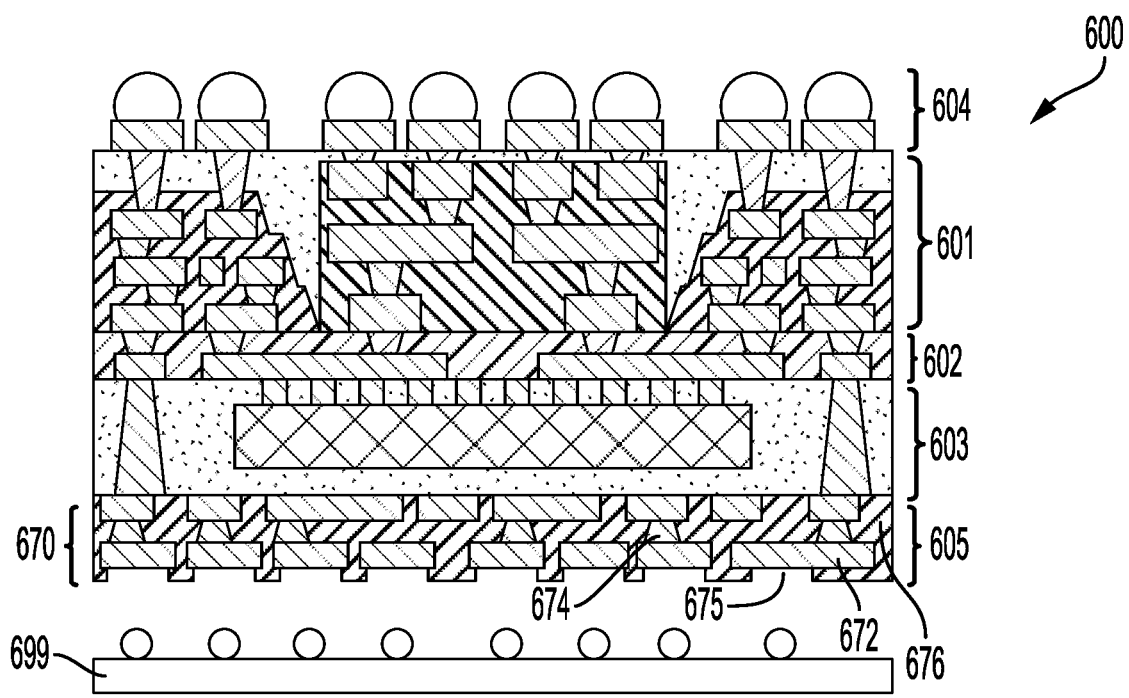

FIG. 6I illustrates FIG. 6H after the structure has been flipped over, after the second carrier 651 has been removed and an optional third metallization structure 670 has been formed. The optional third metallization structure 670 is formed under (i.e., under in the orientation illustrated in FIG. 6I) the third portion 603 of the hybrid package 600. The optional third metallization structure 670 provides additional metal layers for connecting the hybrid package 600 to a second package 699 in a PoP configuration.

The third metallization structure 670 is formed by forming a plurality of dielectric layers 676. A plurality of metal interconnects 672 are formed in the plurality of dielectric layers 676. A plurality of vias 674 connect (e.g., electrically connect) the plurality of metal interconnects 672 that are formed in separate layers of the plurality of dielectric layers 676. A plurality of holes 675 are formed over the topmost plurality of metal interconnects 672 (e.g., 672a) so that if desired, the optional second package 699 can be coupled to the third metallization structure 670 by any known methods (e.g., solder balls, metal interconnects) in a PoP configuration.

Optionally, a second package 699 may be coupled to the hybrid package 600. The hybrid package 600 may be coupled to the second package 699 through the third metallization structure.

Exemplary Flow Diagram of a Method for Fabricating a Hybrid Package

Figure 7:
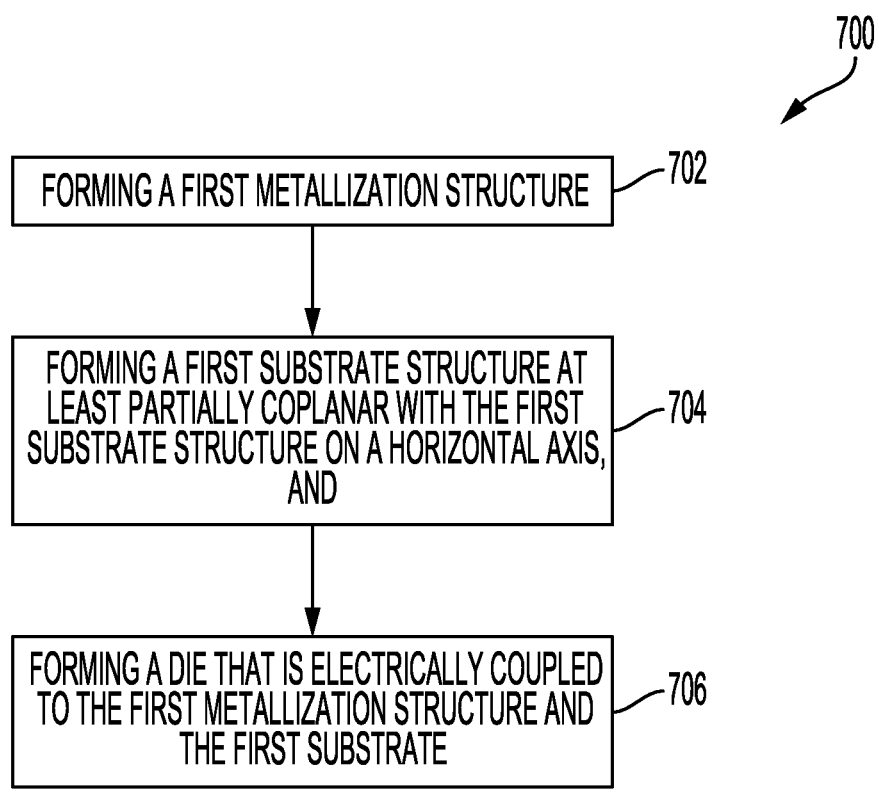
FIG. 7 illustrates an exemplary flow diagram of a method for fabricating a hybrid package.

In some implementations, fabricating a hybrid package includes several processes. FIG. 7 illustrates an exemplary flow diagram of a method 700 for fabricating a hybrid package. In some implementations, the method 700 of FIG. 7 may be used to fabricate the hybrid package of FIGS. 1A, 1B, 2, 3, 4, 5A-5K, and 6A-6I as described in the disclosure.

It should be noted that the sequence of FIG. 7 may combine one or more processes in order to simplify and/or clarify the method for providing or fabricating a die. In some implementations, the order of the processes may be changed or modified.

The method at 702 includes forming a first metallization structure.

The method at 704 includes forming a first substrate structure, the first substrate structure at least partially coplanar with the first substrate structure on a horizontal plane.

Figure 8:
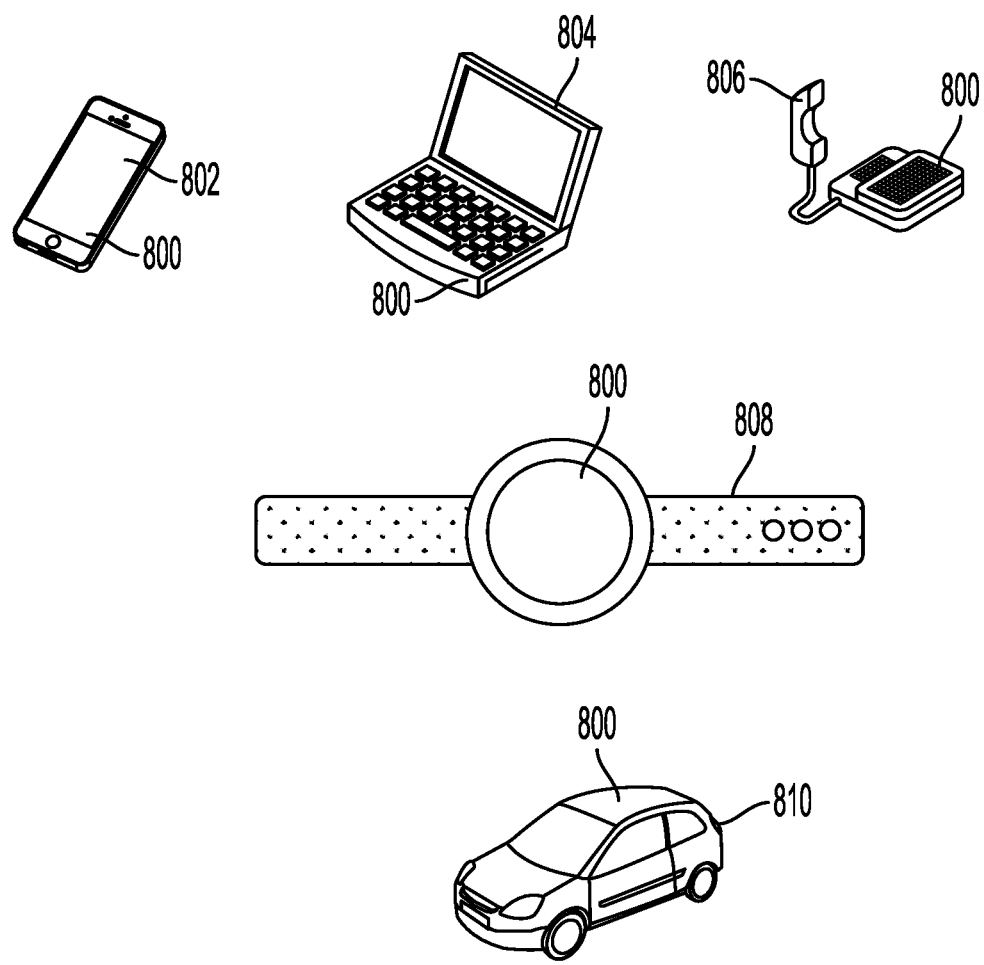
FIG. 8 illustrates various electronic devices that may be integrated with any of the aforementioned hybrid packages.

The method at 706 includes forming a die that is electrically coupled to the first metallization structure and the first substrate Exemplary Electronic Devices FIG. 8 illustrates various electronic devices that may be integrated with any of the aforementioned hybrid packages. For example, a mobile phone device 802, a laptop computer device 804, a fixed location terminal device 806, a wearable device 808 may include an integrated device 800 as described herein. The integrated device 800 may be, for example, any of the substrate, integrated circuits, dies, integrated devices, integrated device packages, integrated circuit devices, device packages, integrated circuit (IC) packages, package-on-package devices described herein. The devices 802, 804, 806, 808 illustrated in FIG. 8 are merely exemplary. Other electronic devices may also feature the integrated device 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1 through 6 (where FIG. 5 includes 5A-5K and where FIG. 6 includes 6A-6I) may be rearranged and/or combined into a single component, process, feature or function or embodied in several components, processes, or functions. Additional elements, components, processes, and/or functions may also be added without departing from the disclosure. It should also be noted that FIGS. 1 through 6 and its corresponding description in the present disclosure is not limited to a hybrid package. In some implementations, FIGS. 1 through 6 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package comprising:
   a first substrate structure comprising:
      at least one substrate dielectric layer; and
      a plurality of substrate interconnects;
   a first metallization structure at least partially coplanar with the first substrate structure, wherein the first metallization structure comprises:
      at least one first dielectric layer; and
      a first plurality of interconnects;
   a plurality of metal interconnects coupled to and touching the first plurality of interconnects of the first metallization structure;
   a first mold coupled to the first substrate structure and the first metallization structure,
      wherein the first mold is located at least between the first substrate structure and the first metallization structure, and
      wherein the first mold at least partially encapsulates the first substrate structure and the plurality of metal interconnects;
   a portion coupled to and touching the plurality of metal interconnects and the plurality of substrate interconnects, wherein the portion comprises:
      at least one portion dielectric layer; and
      a plurality of portion interconnects;
   a second metallization structure coupled to the first metallization structure and the first substrate structure such that the second metallization structure touches the first metallization structure and the first substrate structure, wherein the second metallization structure comprises:
      at least one second dielectric layer; and
      a second plurality of interconnects coupled to (i) the first plurality of interconnects of the first metallization structure and (ii) the plurality of substrate interconnects; and
   a die coupled to the second metallization structure,
      wherein the die is configured to be electrically coupled to the first metallization structure, the first substrate structure and the portion, through the second metallization structure, and
      wherein a first electrical path between the die and the portion includes (i) at least one interconnect from the second plurality of interconnects, (ii) at least one substrate interconnect from the plurality of substrate interconnects and (iii) at least one portion interconnect from the plurality of portion interconnects.

2. The package of claim 1, wherein:
   the first metallization structure is at least partially coplanar with the first substrate structure on a horizontal plane, and
   the first metallization structure is adjacent to the first substrate structure.

3. The package of claim 2, wherein the first metallization structure and the first substrate structure are at least partially separated by a first mold.

4. The package of claim 1,
   wherein the first mold is different from the at least one first dielectric layer, the at least second dielectric layer and the at least one substrate dielectric layer, and
   wherein at least part of the first electrical path between the die and the portion extends through a first side of the first substrate structure and through a second side of the first substrate structure.

5. The package of claim 1, wherein the first substrate structure is surrounded by the first metallization structure.

6. The package of claim 1, wherein the second metallization structure is located between the die and the first substrate structure.

7. The package of claim 1,
   wherein the second metallization structure is located between the die and the first metallization structure, and
   wherein a second electrical path between the die and the portion includes (i) at least one other interconnect from the second plurality of interconnects, (ii) at least one other interconnect from the first plurality of interconnects and (iii) at least one other portion interconnect from the plurality of portion interconnects.

8. The package of claim 1, further comprising:
   a plurality of through mold vias located in the first mold, wherein the plurality of through mold vias are coupled to the first metallization structure.

9. The package of claim 1, further comprising:
a plurality of through mold vias located in the first mold, wherein the plurality of through mold vias are coupled to the first substrate structure.

10. The package of claim 1, further comprising:
a second mold at least partially covering the die,
wherein a first side of the second mold is directly connected to the second metallization structure.

11. The package of claim 10, wherein a second side of the second mold is directly connected to a third metallization structure, the third metallization structure configured to couple to a second package in a package-on-package configuration.

12. The package of claim 1, wherein a top side of the first substrate structure is higher than a top side of the first metallization structure.

13. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

14. A package comprising:
a die;
a first substrate structure comprising:
   at least one substrate dielectric layer; and
   a plurality of substrate interconnects;
a first metallization structure at least partially coplanar with the first substrate structure on a horizontal plane, wherein the first substrate structure is surrounded by the first metallization structure, and
wherein the first metallization structure comprises:
   at least one first dielectric layer; and
   a first plurality of interconnects;
a plurality of metal interconnects coupled to and touching the first plurality of interconnects of the first metallization structure;
a first mold, wherein the first metallization structure and the first substrate structure are at least partially separated by the first mold; and
a portion coupled to and touching the plurality of metal interconnects and the plurality of substrate interconnects, wherein the portion comprises:
   at least one portion dielectric layer; and
   a plurality of portion interconnects;
a second metallization structure, configured to be electrically coupled to the die, the first substrate structure, and the first metallization structure,
   wherein the second metallization structure touches the first metallization structure and the first substrate structure,
   wherein the second metallization structure comprises:
      at least one second dielectric layer; and
      a second plurality of second interconnects, and
   wherein the die is configured to be (i) electrically coupled to the first metallization structure through the second metallization structure, and (ii) electrically coupled to the first substrate structure through the second metallization structure,
   wherein the first metallization structure is configured to provide an electrical path for data signaling,
   wherein the second metallization structure is configured to be coupled to a ground signal,
   wherein the first substrate structure is configured to provide an electrical path for power,
   wherein a first electrical path between the die and the portion includes (i) at least one interconnect from the second plurality of interconnects, (ii) at least one substrate interconnect from the plurality of substrate interconnects and (iii) at least one portion interconnect from the plurality of portion interconnects, and
   wherein at least part of the first electrical path between the die and the portion extends through a first side of the first substrate structure and through a second side of the first substrate structure.

15. The package of claim 14, wherein:
the first plurality of interconnects include pads having a first thickness, and
the plurality of substrate interconnects include pads having a second thickness, wherein the second thickness is greater than the first thickness.

16. The package of claim 14, wherein:
the first metallization structure includes a plurality of first vias having a first via width,
the first substrate structure includes a plurality of substrate vias having a substrate via width, wherein the substrate via width is greater than the first via width.

17. A method of forming a package, comprising:
forming a second metallization structure comprising:
   at least one second dielectric layer; and
   a second plurality of interconnects;
forming a first metallization structure such that the first metallization structure is coupled to the second metallization structure, wherein the first metallization structure comprises:
   at least one first dielectric layer; and
   a first plurality of interconnects;
forming a first substrate structure such that the first substrate structure is coupled to the second metallization structure,
   wherein the first substrate structure is at least partially coplanar with the first substrate structure on a horizontal plane, wherein the second metallization structure touches the first metallization structure and the first substrate structure, and
   wherein the first substrate structure comprises:
      at least one substrate dielectric layer; and
      a plurality of substrate interconnects;
forming a plurality of metal interconnects that are coupled to and touching the first metallization structure;
forming a first mold that is coupled to the first substrate structure and the first metallization structure such that the first mold is located at least between the first substrate structure and the first metallization structure; and
forming a portion that is coupled to and touching the plurality of metal interconnects, wherein the portion comprises:
   at least one portion dielectric layer; and
   a plurality of portion interconnects;
coupling a die to the second metallization structure,
wherein the die is configured to be electrically coupled to the first metallization structure and the first substrate structure through the second metallization structure,
wherein a first electrical path between the die and the portion includes (i) at least one interconnect from the second plurality of interconnects, (ii) at least one substrate interconnect from the plurality of substrate interconnects and (iii) at least one portion interconnect from the plurality of portion interconnects, and wherein at least part of the first electrical path between the die and the portion extends through a first side of the first substrate structure and through a second side of the first substrate structure.

18. The method of claim 17, wherein forming the first metallization structure includes forming the first metallization to at least partially surround the first substrate structure.

19. The method of claim 17, further comprising:
forming a second mold that is coupled to the die and the second metallization portion.

20. The method of claim 17, further comprising:
forming a plurality of through mold vias located in the first mold such that the plurality of through mold vias are coupled to the first metallization structure and/or the first substrate structure.

21. The method of claim 17,
wherein the second metallization structure is configured to be electrically coupled to a ground signal; and
wherein the first metallization structure is an electrical path for signaling,
wherein the first substrate structure is configured to provide an electrical path for power.

22. The method of claim 17, wherein a second electrical path between the die and the portion includes (i) at least one other interconnect from the second plurality of interconnects, (ii) at least one other interconnect from the first plurality of interconnects and (iii) at least one other portion interconnect from the plurality of portion interconnects.

23. The method of claim 22, wherein:
forming the first metallization structure includes forming a plurality of first vias having a first via width, and
forming the first substrate structure includes forming a plurality of substrate vias having a substrate via width, wherein the substrate via width is greater than the first via width.

24. The method of claim 17, wherein a top side of the first substrate structure is higher than a top side of the first metallization structure.

\* \* \* \* \*